United States Patent
Chinen et al.

(10) Patent No.: US 12,002,830 B2
(45) Date of Patent: Jun. 4, 2024

(54) DETECTION DEVICE AND METHOD FOR MANUFACTURING THE SAME

(71) Applicant: Japan Display Inc., Tokyo (JP)

(72) Inventors: Satoshi Chinen, Tokyo (JP); Morikazu Nomura, Tokyo (JP)

(73) Assignee: Japan Display Inc., Tokyo (JP)

( * ) Notice: Subject to any disclaimer, the term of this patent is extended or adjusted under 35 U.S.C. 154(b) by 277 days.

(21) Appl. No.: 17/483,296

(22) Filed: Sep. 23, 2021

(65) Prior Publication Data

US 2022/0102416 A1   Mar. 31, 2022

(30) Foreign Application Priority Data

Sep. 25, 2020   (JP) ................. 2020-161107

(51) Int. Cl.
| | | |
|---|---|---|
| *H01L 27/146* | (2006.01) | |
| *H01L 31/105* | (2006.01) | |
| *H01L 31/18* | (2006.01) | |
| *G06V 40/13* | (2022.01) | |

(52) U.S. Cl.
CPC .. *H01L 27/14627* (2013.01); *H01L 27/14623* (2013.01); *H01L 27/14645* (2013.01); *H01L 31/105* (2013.01); *H01L 31/18* (2013.01); *G06V 40/1318* (2022.01)

(58) Field of Classification Search
CPC ......... H01L 27/14627; H01L 27/14623; H01L 27/14645; H01L 27/1463; H01L 27/14634; H01L 27/14685; H01L 27/1469; H01L 31/105; H01L 31/18; H01L 31/02019; H01L 31/0203; H01L 31/02325; H01L 31/1055; G06V 40/1318
See application file for complete search history.

(56) References Cited

U.S. PATENT DOCUMENTS

| | | | |
|---|---|---|---|
| 2016/0014362 A1* | 1/2016 | Kurokawa | G01S 17/894 |
| | | | 348/297 |
| 2017/0077159 A1* | 3/2017 | Kubota | G03F 7/033 |
| 2020/0089928 A1 | 3/2020 | Long | |
| 2021/0248977 A1* | 8/2021 | Zhang | G09G 5/10 |
| 2022/0059710 A1 | 2/2022 | Kwon et al. | |

FOREIGN PATENT DOCUMENTS

| | | |
|---|---|---|
| JP | 2004356270 | 12/2004 |
| JP | 2020031104 | 2/2020 |
| JP | 2022035262 | 3/2022 |

OTHER PUBLICATIONS

Japanese Office Action dated Jan. 30, 2024 in corresponding Japanese Application No. 2020-161107.

\* cited by examiner

*Primary Examiner* — Sitaramarao S Yechuri
(74) *Attorney, Agent, or Firm* — K&L Gates LLP

(57) ABSTRACT

According to an aspect, a detection device includes: a substrate; a plurality of photodiodes arranged on a first principal surface of the substrate; a protective film that covers the photodiodes; a plurality of lenses provided for each of the photodiodes so as to face the photodiode with the protective film interposed between the lenses and the photodiodes; and a projection provided between the lenses. A top of the projection is located at a position higher than a top of each of the lenses when viewed from the first principal surface.

13 Claims, 20 Drawing Sheets

DETECTION DEVICE AND METHOD FOR MANUFACTURING THE SAME

CROSS-REFERENCE TO RELATED APPLICATION

This application claims the benefit of priority from Japanese Patent Application No. 2020-161107 filed on Sep. 25, 2020, the entire contents of which are incorporated herein by reference.

BACKGROUND

1. Technical Field

What is disclosed herein relates to a detection device and a method for manufacturing the same.

2. Description of the Related Art

United States Patent Application Publication No. 2020/0089928 describes an optical imaging device that includes a light-blocking layer provided with an opening between a microlens and a photosensor. A positive-intrinsic-negative (PIN) photodiode is known as such a photosensor.

A detection device using the PIN photodiode is required to be made thinner. The detection device is formed of a single array substrate provided with a plurality of photodiodes and a plurality of microlenses. In this case, the substrate may be difficult to be polished because, for example, the microlenses formed on the array substrate are damaged in a polishing process of the substrate.

SUMMARY

According to an aspect, a detection device includes: a substrate; a plurality of photodiodes arranged on a first principal surface of the substrate; a protective film that covers the photodiodes; a plurality of lenses provided for each of the photodiodes so as to face the photodiode with the protective film interposed between the lenses and the photodiodes; and a projection provided between the lenses. A top of the projection is located at a position higher than a top of each of the lenses when viewed from the first principal surface.

According to an aspect, a method for manufacturing a detection device, the detection device including a substrate, a plurality of photodiodes arranged on a first principal surface of the substrate, a protective film provided on the substrate so as to cover the photodiodes, and a plurality of lenses provided for each of the photodiodes so as to overlap the photodiode, the method includes: stacking a pair of substrates together, with the first principal surfaces of the pair of the substrates facing each other, the substrates each having a projection formed on the substrate, the projection having a height greater than a height of the lenses in a direction orthogonal to the substrate; and polishing a second principal surface on an opposite side of the first principal surface of each of the substrates in a state where the pair of the substrates are stacked together. At the stacking the pair of the substrates together, the projection of one of the detection devices abuts on a portion of another of the detection devices facing the one detection device, and the lenses of the one detection device face the lenses of the other detection device without contacting one another.

DETAILED DESCRIPTION

Figure 1A:
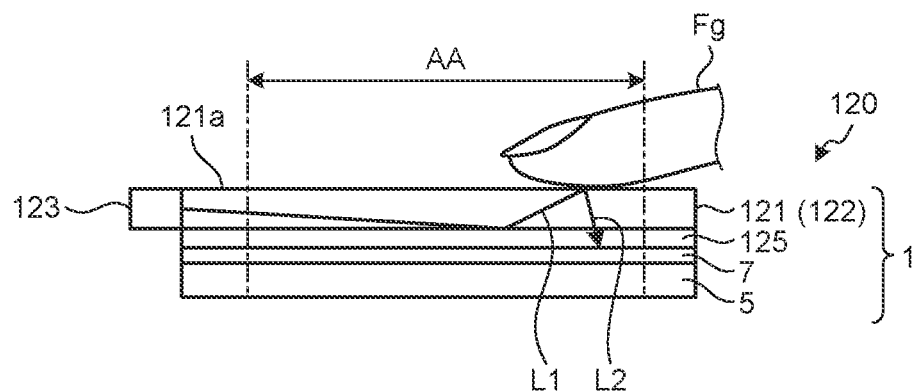
FIG. 1A is a sectional view illustrating a schematic sectional configuration of a detection apparatus with an illumination device, the detection apparatus including a detection device according to an embodiment.

The following describes a mode (embodiment) for carrying out the present disclosure in detail with reference to the drawings. The present disclosure is not limited to the description of the embodiment given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the disclosure.

To further clarify the description, widths, thicknesses, shapes, and the like of various parts may be schematically illustrated in the drawings as compared with actual aspects thereof. However, they are merely examples, and interpretation of the present disclosure is not limited thereto. The same component as that described with reference to an already mentioned drawing is denoted by the same reference numeral through the disclosure and the drawings, and detailed description thereof may not be repeated where appropriate.

In the present specification and claims, in expressing an aspect of disposing another structure on or above a certain structure, a case of simply expressing "on" includes both a case of disposing the other structure immediately on the certain structure such that the other structure contacts the certain structure and a case of disposing the other structure above the certain structure with still another structure interposed therebetween, unless otherwise specified.

Figure 1B:
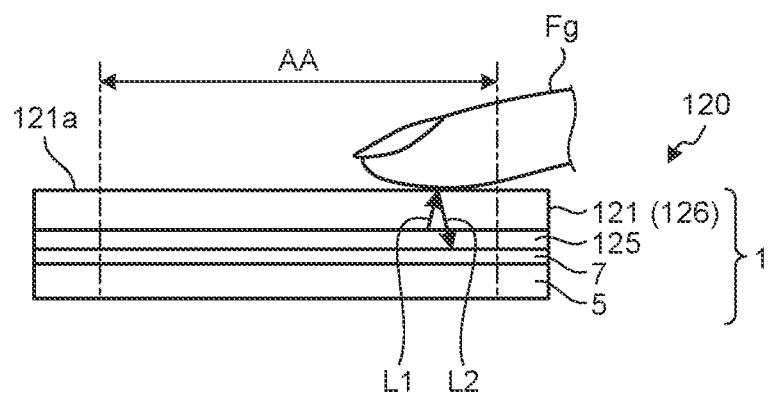
FIG. 1B is a sectional view illustrating a schematic sectional configuration of the detection apparatus with an illumination device, the detection apparatus including the detection device according to a first modification.
Figure 1C:
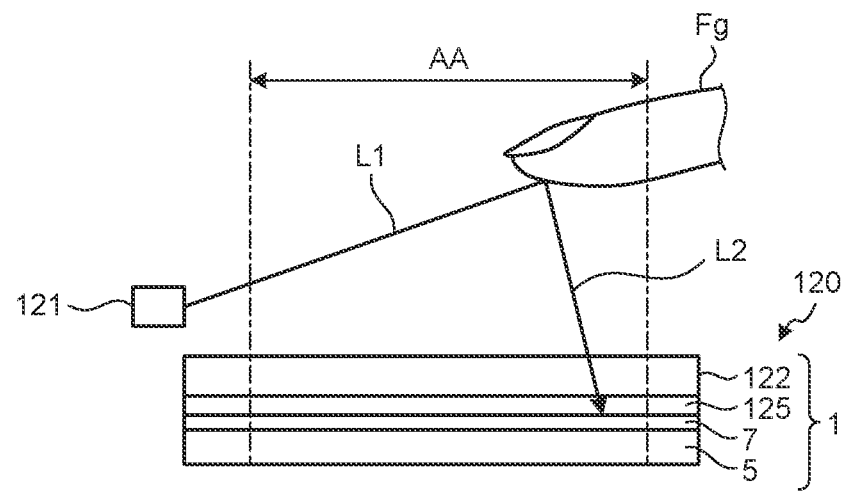
FIG. 1C is a sectional view illustrating a schematic sectional configuration of the detection apparatus with an illumination device, the detection apparatus including the detection device according to a second modification.
Figure 1D:
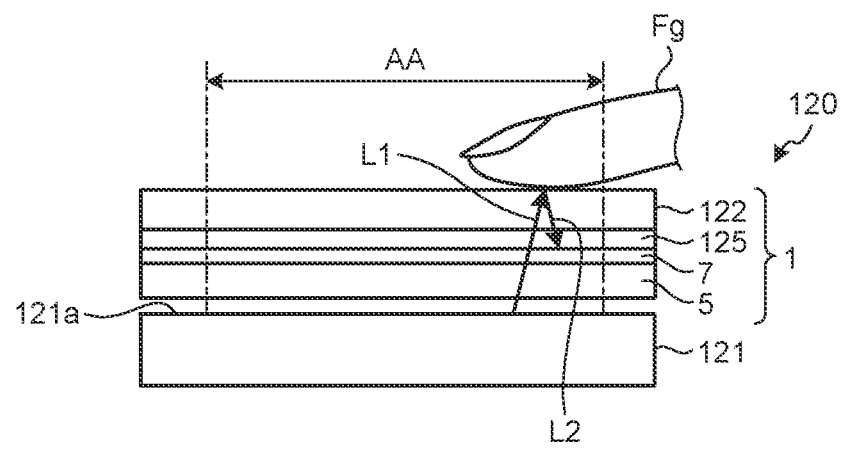
FIG. 1D is a sectional view illustrating a schematic sectional configuration of the detection apparatus with an illumination device, the detection apparatus including the detection device according to a third modification.

FIG. 1A is a sectional view illustrating a schematic sectional configuration of a detection apparatus with an illumination device, the detection apparatus including a detection device according to an embodiment of the present disclosure. FIG. 1B is a sectional view illustrating a schematic sectional configuration of the detection apparatus with an illumination device, the detection apparatus including the detection device according to a first modification of the embodiment. FIG. 1C is a sectional view illustrating a schematic sectional configuration of the detection apparatus with an illumination device, the detection apparatus including the detection device according to a second modification of the embodiment. FIG. 1D is a sectional view illustrating a schematic sectional configuration of the detection apparatus with an illumination device, the detection apparatus including the detection device according to a third modification of the embodiment.

As illustrated in FIG. 1A, a detection apparatus 120 with an illumination device includes a detection device 1 and an illumination device 121. The detection device 1 includes a sensor substrate 5, an optical filter 7, an adhesive layer 125, and a cover member 122. That is, the sensor substrate 5, the optical filter 7, the adhesive layer 125, and the cover member 122 are stacked in the order as listed, in a direction orthogonal to a surface of the sensor substrate 5. The cover member 122 of the detection device 1 can be replaced with the illumination device 121, as will be described later. The adhesive layer 125 only needs to bond the optical filter 7 to the cover member 122. Hence, the detection device 1 may have a structure without the adhesive layer 125 in a region corresponding to a detection region AA. When the adhesive layer 125 is absent in the detection region AA, the detection device 1 has a structure in which the adhesive layer 125 bonds the cover member 122 to the optical filter 7 in a region corresponding to a peripheral region GA outside the detection region AA. The adhesive layer 125 provided in the detection region AA may be simply paraphrased as a protective layer for the optical filter 7.

As illustrated in FIG. 1A, the illumination device 121 may be, for example, what is called a side light-type front light that uses the cover member 122 as a light guide plate provided at a location corresponding to a detection region AA of the detection device 1, and that includes a plurality of light sources 123 arranged side by side at one end or both ends of the cover member 122. That is, the cover member 122 has a light-emitting surface 121a for emitting light, and serves as one component of the illumination device 121. The illumination device 121 emits light L1 from the light-emitting surface 121a of the cover member 122 toward a finger Fg serving as a detection target. For example, light-emitting diodes (LEDs) for emitting light in a predetermined color are used as the light sources.

As illustrated in FIG. 1B, the illumination device 121 may include light sources (such as LEDs) provided immediately below the detection region AA of the detection device 1, and the illumination device 121 including the light sources serves also as the cover member 122.

The illumination device 121 is not limited to the example of FIG. 1B. As illustrated in FIG. 1C, the illumination device 121 may be provided on a lateral side of or above the cover member 122, and may emit the light L1 to the finger Fg from the lateral side of or above the finger Fg.

Furthermore, as illustrated in FIG. 1D, the illumination device 121 may be what is called a direct-type backlight that includes light sources (such as LEDs) provided in the detection region of the detection device 1.

The light L1 emitted from the illumination device 121 is reflected as light L2 by the finger Fg serving as the detection target. The detection device 1 detects the light L2 reflected by the finger Fg (shading of the light L2 or an intensity of the reflected light) to detect asperities (such as a fingerprint) on the surface of the finger Fg. The detection device 1 may further detect the light L2 reflected inside the finger Fg to detect information on a living body in addition to detecting the fingerprint. Examples of the information on the living body include a blood vessel image of, for example, a vein, pulsation, and a pulse wave. The color of the light L1 from the illumination device 121 may be varied depending on the detection target.

The cover member 122 is a member for protecting the sensor substrate 5 and the optical filter 7, and covers the sensor substrate 5 and the optical filter 7. The illumination device 121 may have a structure to double as the cover member 122 as described above. In the structures illustrated in FIGS. 1C and 1D in which the cover member 122 is separate from the illumination device 121, the cover member 122 is, for example, a glass substrate. The cover member 122 is not limited to the glass substrate, and may be, for example, a resin substrate or may have a configuration including a plurality of layers obtained by stacking these substrates. The cover member 122 need not be provided. In this case, the surfaces of the sensor substrate 5 and the optical filter 7 are provided with a protective layer of, for example, an insulating film, and the finger Fg contacts the protective layer of the detection device 1.

As illustrated in FIG. 1B, the detection apparatus 120 with an illumination device may be provided with a display panel 126 instead of the illumination device 121. The display panel 126 may be, for example, an organic electroluminescent (EL) diode (organic light-emitting diode (OLED)) display panel or an inorganic EL display (micro-LED or mini-LED). Alternatively, the display panel 126 may be a liquid crystal display (LCD) panel using liquid crystal elements as display elements or an electrophoretic display (EPD) panel using electrophoretic elements as the display elements. In this case, display light (light L1) emitted from the display panel 126 is reflected by the finger Fg, and the reflected light passes through the display panel 126 to reach the optical filter 7. In view of this fact, the display panel 126 is preferably configured with a substrate or a multilayered film having light transmissivity. The fingerprint of the finger Fg and the information on the living body can be detected based on the light L2.

Figure 2:
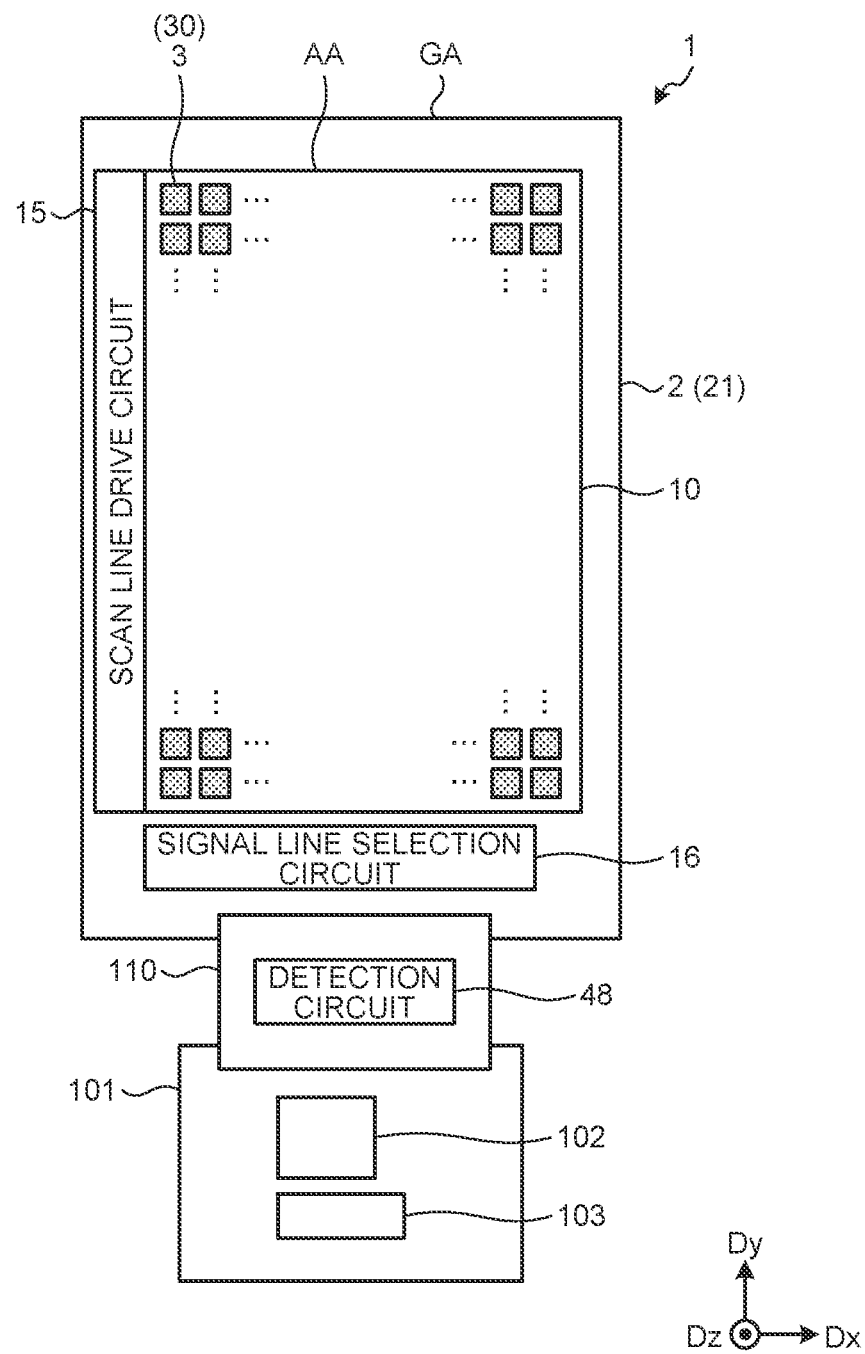
FIG. 2 is a plan view illustrating the detection device according to the embodiment.

FIG. 2 is a plan view illustrating the detection device according to the embodiment. A first direction Dx illustrated in FIG. 2 and the subsequent drawings is one direction in a plane parallel to a substrate 21. A second direction Dy is a direction in the plane parallel to the substrate 21 and is a direction orthogonal to the first direction Dx. The second direction Dy may intersect the first direction Dx without being orthogonal thereto. A third direction Dz is a direction orthogonal to the first direction Dx and the second direction Dy and is a direction normal to the substrate 21.

As illustrated in FIG. 2, the detection device 1 includes an array substrate 2 (substrate 21), a sensor 10, a scan line drive circuit 15, a signal line selection circuit 16, a detection circuit 48, a control circuit 102, and a power supply circuit 103.

The substrate 21 is electrically coupled to a control substrate 101 through a wiring substrate 110. The wiring substrate 110 is, for example, a flexible printed circuit board or a rigid circuit board. The wiring substrate 110 is provided with the detection circuit 48. The control substrate 101 is provided with the control circuit 102 and the power supply circuit 103. The control circuit 102 is, for example, a field-programmable gate array (FPGA). The control circuit 102 supplies control signals to the sensor 10, the scan line drive circuit 15, and the signal line selection circuit 16 to control operations of the sensor 10. The power supply circuit 103 supplies voltage signals including, for example, a power supply potential VDD and a reference potential VCOM (refer to FIG. 4) to the sensor 10, the scan line drive circuit 15, and the signal line selection circuit 16. Although the present embodiment exemplifies the case of disposing the detection circuit 48 on the wiring substrate 110, the present disclosure is not limited to this case. The detection circuit 48 may be disposed on the substrate 21.

The substrate 21 has the detection region AA and the peripheral region GA. The detection region AA and the peripheral region GA extend in planar directions parallel to the substrate 21. Elements (detection elements 3) of the sensor 10 are provided in the detection region AA. The peripheral region GA is a region outside the detection region AA and is a region not provided with the elements (detection elements 3). That is, the peripheral region GA is a region between the outer circumference of the detection region AA and outer edges of the substrate 21. The scan line drive circuit 15 and the signal line selection circuit 16 are provided in the peripheral region GA. The scan line drive circuit 15 is provided in a region extending along the second direction Dy in the peripheral region GA. The signal line selection circuit 16 is provided in a region extending along the first direction Dx in the peripheral region GA, and is provided between the sensor 10 and the detection circuit 48.

Each of the detection elements 3 of the sensor 10 is a photosensor including a photodiode 30 as a sensor element. The photodiode 30 is a photoelectric conversion element, and outputs an electrical signal corresponding to light irradiating each of the photodiodes 30. More specifically, the photodiode 30 is a positive-intrinsic-negative (PIN) photodiode. The photodiode 30 may be paraphrased as an organic photodiode (OPD). The detection elements 3 are arranged in a matrix having a row-column configuration in the detection region AA. The photodiode 30 included in each of the detection elements 3 performs the detection in accordance with a gate drive signal (for example, a reset control signal RST or a read control signal RD) supplied from the scan line drive circuit 15. Each of the photodiodes 30 outputs the electrical signal corresponding to the light irradiating the photodiode 30 as a detection signal Vdet to the signal line selection circuit 16. The detection device 1 detects the information on the living body based on the detection signals Vdet received from the photodiodes 30.

Figure 3:
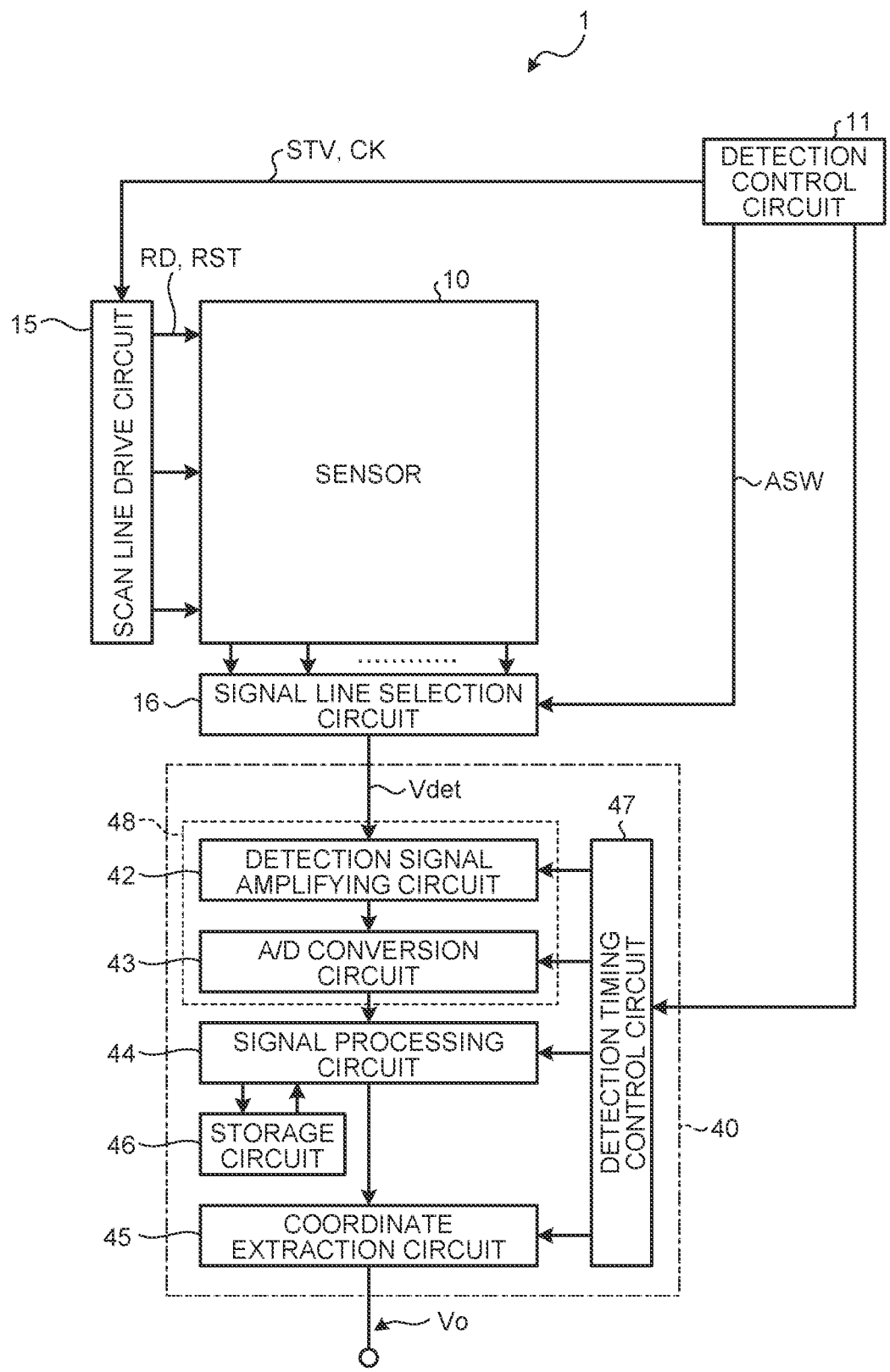
FIG. 3 is a block diagram illustrating a configuration example of the detection device according to the embodiment.

FIG. 3 is a block diagram illustrating a configuration example of the detection device according to the embodiment. As illustrated in FIG. 3, the detection device 1 further includes a detection control circuit 11 and a detector 40. One, some, or all functions of the detection control circuit 11 are included in the control circuit 102. One, some, or all functions of the detector 40 other than those of the detection circuit 48 are also included in the control circuit 102.

The detection control circuit 11 supplies control signals to the scan line drive circuit 15, the signal line selection circuit 16, and the detector 40 to control operations of these components. The detection control circuit 11 supplies various control signals including, for example, a start signal STV and a clock signal CK to the scan line drive circuit 15. The detection control circuit 11 also supplies various control signals including, for example, a selection signal ASW to the signal line selection circuit 16.

The scan line drive circuit 15 drives a plurality of scan lines (read control scan line GLrd and reset control scan lines GLrst (refer to FIG. 4)) based on the various control signals. The scan line drive circuit 15 sequentially or simultaneously selects the scan lines, and supplies the gate drive signal (for example, the reset control signal RST or the read control signal RD) to the selected scan lines. Through this operation, the scan line drive circuit 15 selects the photodiodes 30 coupled to the scan lines.

Figure 4:
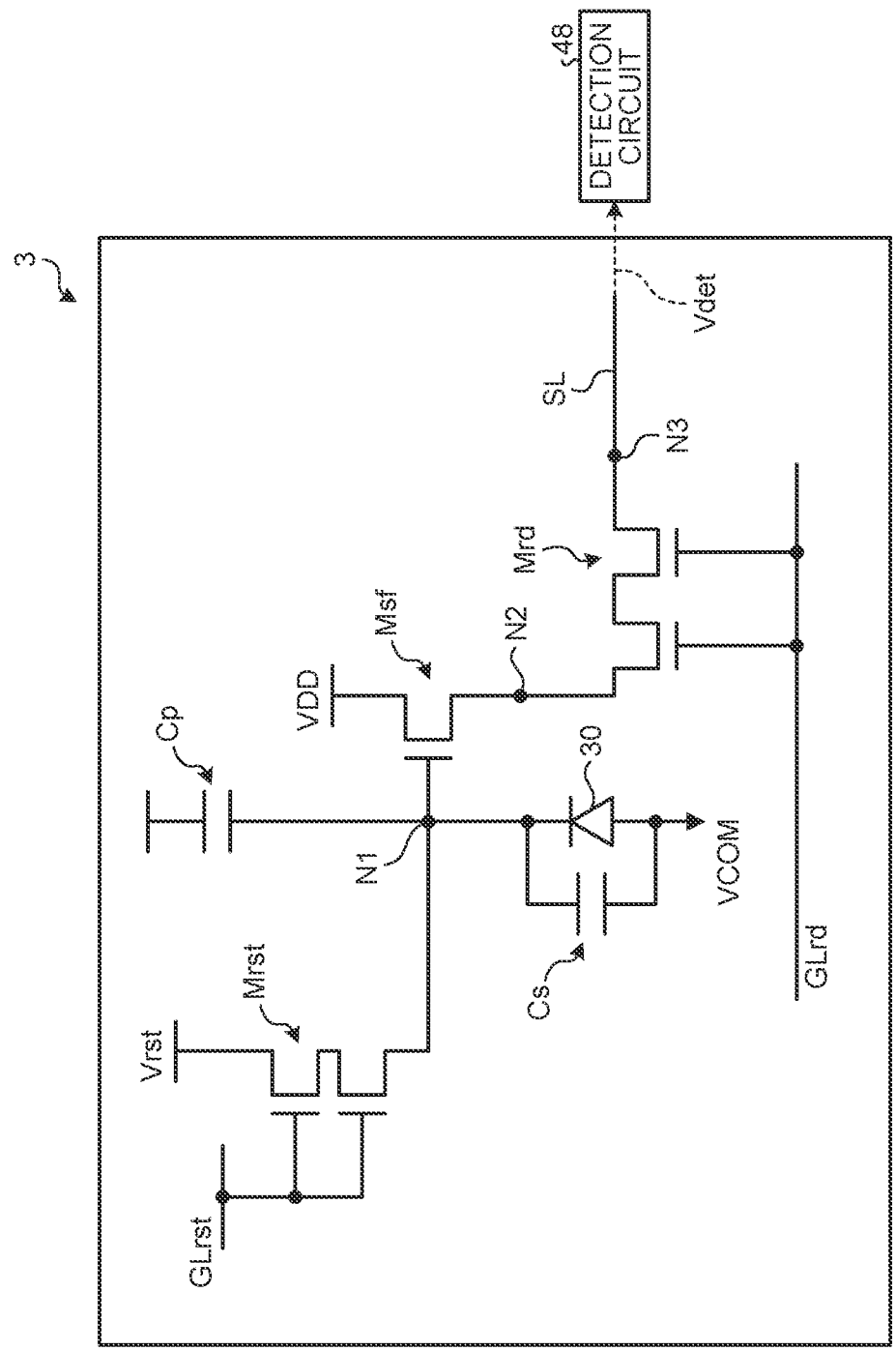
FIG. 4 is a circuit diagram illustrating a detection element.

The signal line selection circuit 16 is a switching circuit that sequentially or simultaneously selects output signal lines SL (refer to FIG. 4). The signal line selection circuit 16 is, for example, a multiplexer. The signal line selection circuit 16 couples the selected output signal lines SL to the detection circuit 48 based on the selection signal ASW supplied from the detection control circuit 11. Through this operation, the signal line selection circuit 16 outputs the detection signal Vdet of the photodiode 30 to the detector 40.

The detector 40 includes the detection circuit 48, a signal processing circuit 44, a coordinate extraction circuit 45, a storage circuit 46, and a detection timing control circuit 47. The detection timing control circuit 47 performs control to cause the detection circuit 48, the signal processing circuit 44, and the coordinate extraction circuit 45 to operate in synchronization with one another based on a control signal supplied from the detection control circuit 11.

The detection circuit 48 is, for example, an analog front end (AFE) circuit. The detection circuit 48 is a signal processing circuit having functions of at least a detection signal amplifying circuit 42 and an analog-to-digital (A/D) conversion circuit 43. The detection signal amplifying circuit 42 is a circuit that amplifies the detection signal Vdet, and is, for example, an integration circuit. The A/D conversion circuit 43 converts an analog signal output from the detection signal amplifying circuit 42 into a digital signal.

The signal processing circuit 44 is a logic circuit that detects a predetermined physical quantity received by the sensor 10 based on output signals of the detection circuit 48. The signal processing circuit 44 can detect asperities on a surface of the finger Fg or a palm (fingerprint or palm print) based on the signals from the detection circuit 48 when the finger Fg is in contact with or in proximity to a detection surface. The signal processing circuit 44 may detect the information on the living body based on the signals from the detection circuit 48. Examples of the information on the living body include a blood vessel image of the finger Fg or the palm, a pulse wave, pulsation, and blood oxygen saturation.

The storage circuit 46 temporarily stores therein signals calculated by the signal processing circuit 44. The storage circuit 46 may be, for example, a random-access memory (RAM) or a register circuit.

The coordinate extraction circuit 45 is a logic circuit that obtains detected coordinates of the asperities on the surface of the finger Fg or the like when the contact or proximity of the finger Fg is detected by the signal processing circuit 44. The coordinate extraction circuit 45 is the logic circuit that also obtains detected coordinates of blood vessels of the finger Fg or the palm. The coordinate extraction circuit 45 combines the detection signals Vdet output from the respective detection elements 3 of the sensor 10 to generate two-dimensional information representing a shape of the asperities on the surface of the finger Fg or the like. The coordinate extraction circuit 45 may output the detection signals Vdet as sensor outputs Vo instead of calculating the detected coordinates.

The following describes a circuit configuration example of the detection device 1. FIG. 4 is a circuit diagram illustrating the detection element. As illustrated in FIG. 4, the detection element 3 includes the photodiode 30, a reset transistor Mrst, a read transistor Mrd, and a source follower transistor Msf. The reset transistor Mrst, the read transistor Mrd, and the source follower transistor Msf are provided correspondingly to each of the photodiodes 30. Each of the reset transistor Mrst, the read transistor Mrd, and the source follower transistor Msf is made up of an n-type thin-film transistor (TFT). However, each of the transistors is not limited thereto, and may be made up of a p-type TFT.

The reference potential VCOM is applied to an anode of the photodiode 30. A cathode of the photodiode 30 is coupled to a node N1. The node N1 is coupled to a capacitance Cs, one of the source and the drain of the reset transistor Mrst, and the gate of the source follower transistor Msf. In addition, the node N1 has parasitic capacitance Cp. When light enters the photodiode 30, a signal (electrical charge) output from the photodiode 30 is stored in the capacitance Cs.

Figure 6:
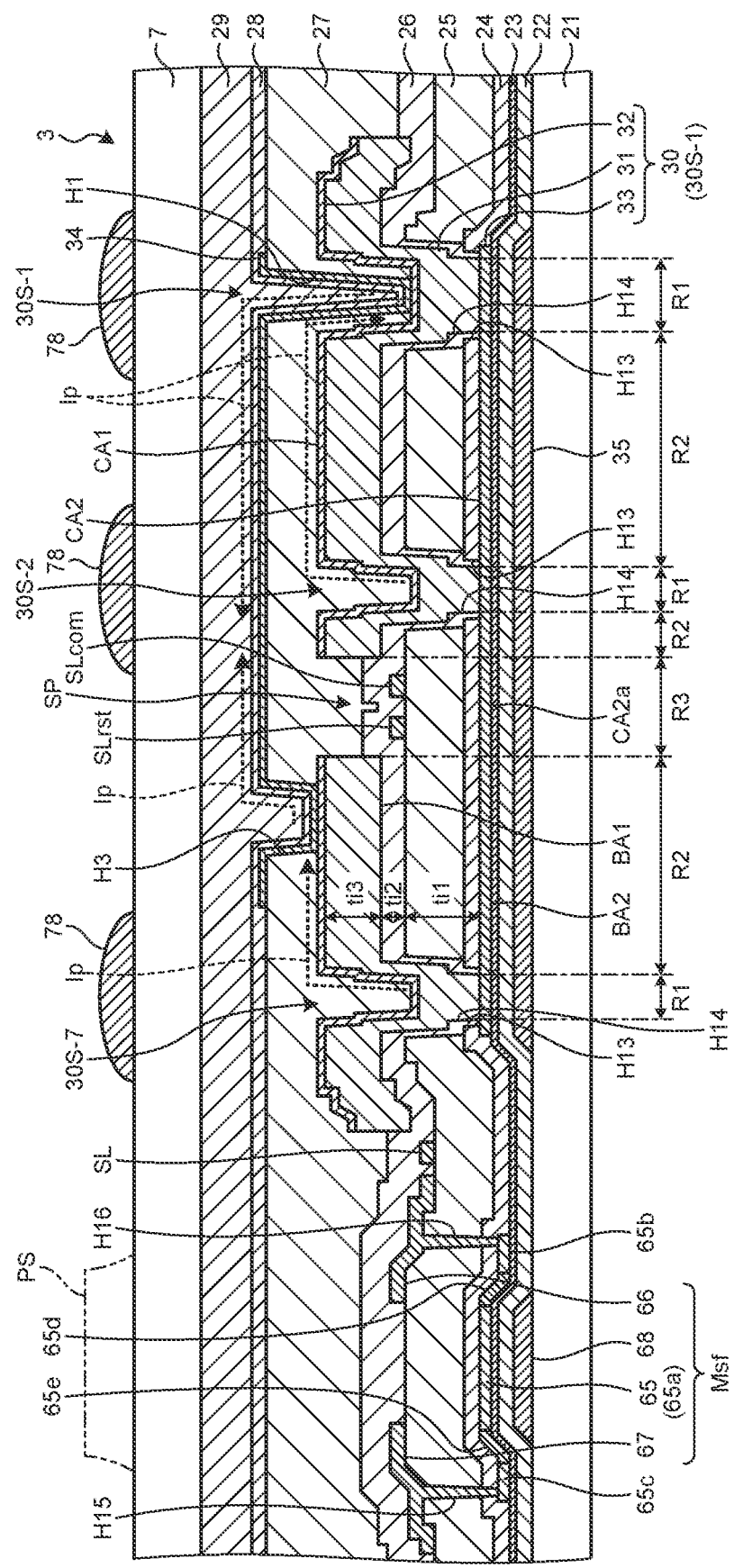
FIG. 6 is a VI-VI' sectional view of FIG. 5.

The capacitance Cs is, for example, capacitance generated between a p-type semiconductor layer 33 and an n-type semiconductor layer 32 of the photodiode 30 (refer to FIG. 6). The parasitic capacitance Cp is capacitance added to the capacitance Cs, and is also capacitance generated among various types of wiring and electrodes provided on the array substrate 2.

The gates of the reset transistor Mrst are coupled to the reset control scan line GLrst. The other of the source and the drain of the reset transistor Mrst is supplied with a reset potential Vrst. When the reset transistor Mrst is turned on (into a conduction state) in response to the reset control signal RST, the potential of the node N1 is reset to the reset potential Vrst. The reference potential VCOM is lower than the reset potential Vrst, and the photodiode 30 is driven in a reverse bias state.

The source follower transistor Msf is coupled between a terminal supplied with the power supply potential VDD and the read transistor Mrd (node N2). The gate of the source follower transistor Msf is coupled to the node N1. The gate of the source follower transistor Msf is supplied with the signal (electrical charge) generated by the photodiode 30. This operation causes the source follower transistor Msf to output a voltage signal corresponding to the signal (electrical charge) generated by the photodiode 30 to the read transistor Mrd.

The read transistor Mrd is coupled between the source of the source follower transistor Msf (node N2) and the output signal line SL (node N3). The gates of the read transistor Mrd are coupled to the read control scan line GLrd. When the read transistor Mrd is turned on in response to the read control signal RD, the signal output from the source follower transistor Msf, that is, the voltage signal corresponding to the signal (electrical charge) generated by the photodiode 30 is output as the detection signal Vdet to the output signal line SL.

In the example illustrated in FIG. 4, the reset transistor Mrst and the read transistor Mrd each have what is called a double-gate structure configured by coupling two transistors in series. However, the reset transistor Mrst and the read transistor Mrd are not limited to this structure, and may have a single-gate structure, or a multi-gate structure including three or more transistors coupled in series. The circuit of the detection element 3 is not limited to the configuration including the three transistors of the reset transistor Mrst, the source follower transistor Msf, and the read transistor Mrd. The detection element 3 may include two transistors, or four or more transistors.

Figure 5:
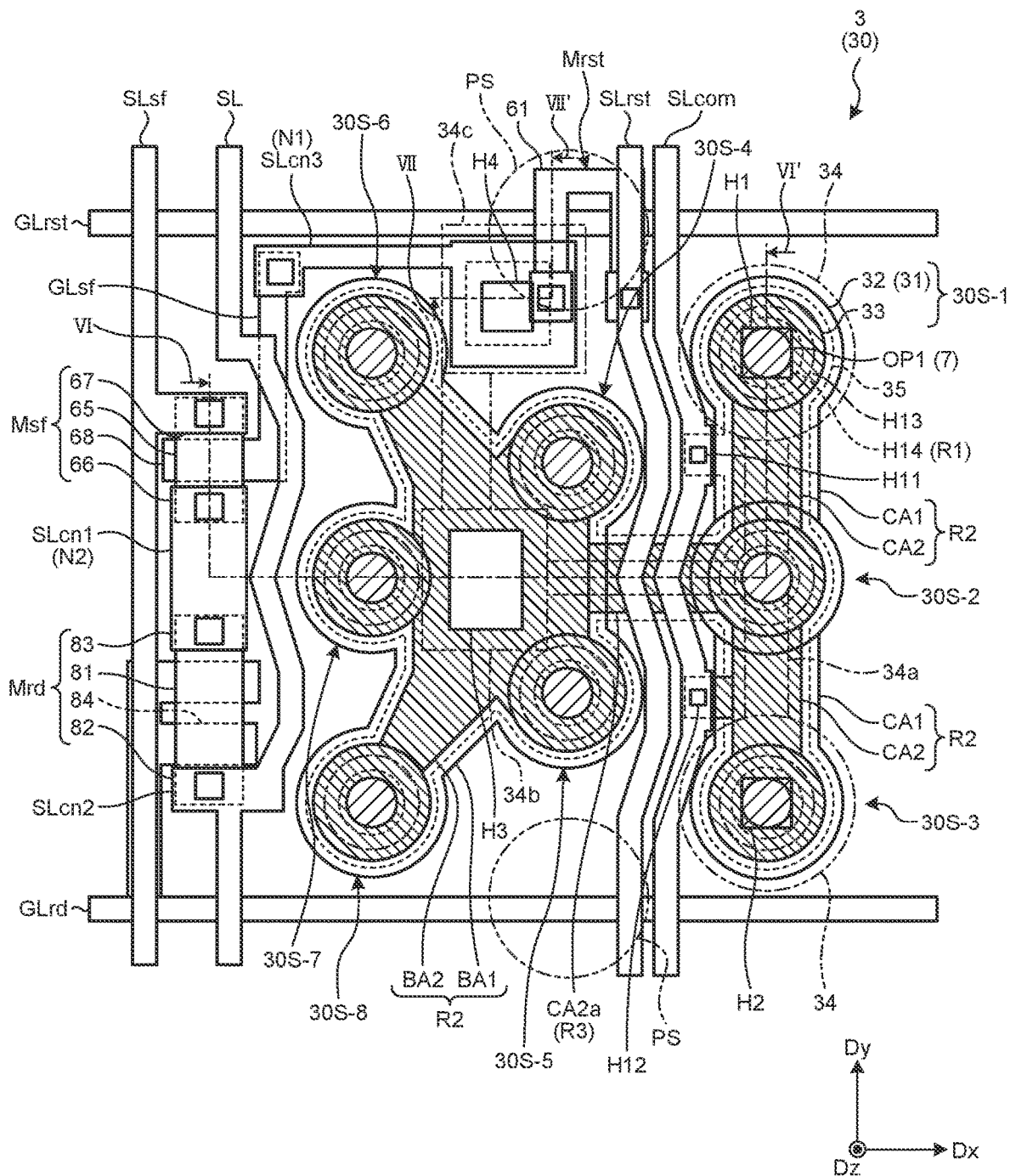
FIG. 5 is a plan view illustrating the detection element.

The following describes a planar configuration and a sectional configuration of the detection element 3. FIG. 5 is a plan view illustrating the detection element. As illustrated in FIG. 5, the detection element 3 includes two scan lines (the read control scan line GLrd and the reset control scan line GLrst) and four signal lines (the output signal line SL, a power supply signal line SLsf, a reset signal line SLrst, and a reference signal line SLcom).

The read control scan line GLrd and the reset control scan line GLrst extend in the first direction Dx and are arranged in the second direction Dy. The output signal line SL, the power supply signal line SLsf, the reset signal line SLrst, and the reference signal line SLcom extend in the second direction Dy and are arranged in the first direction Dx.

The detection element 3 is defined as a region surrounded by the two scan lines (the read control scan line GLrd and the reset control scan line GLrst) and two signal lines (for example, two power supply signal lines SLsf of the adjacent detection elements 3).

As illustrated in FIG. 5, the photodiode 30 includes a plurality of partial photodiodes 30S-1, 30S-2, . . . , 30S-8. The partial photodiodes 30S-1, 30S-2, . . . , 30S-8 are arranged in a triangular lattice pattern.

Figure 9:
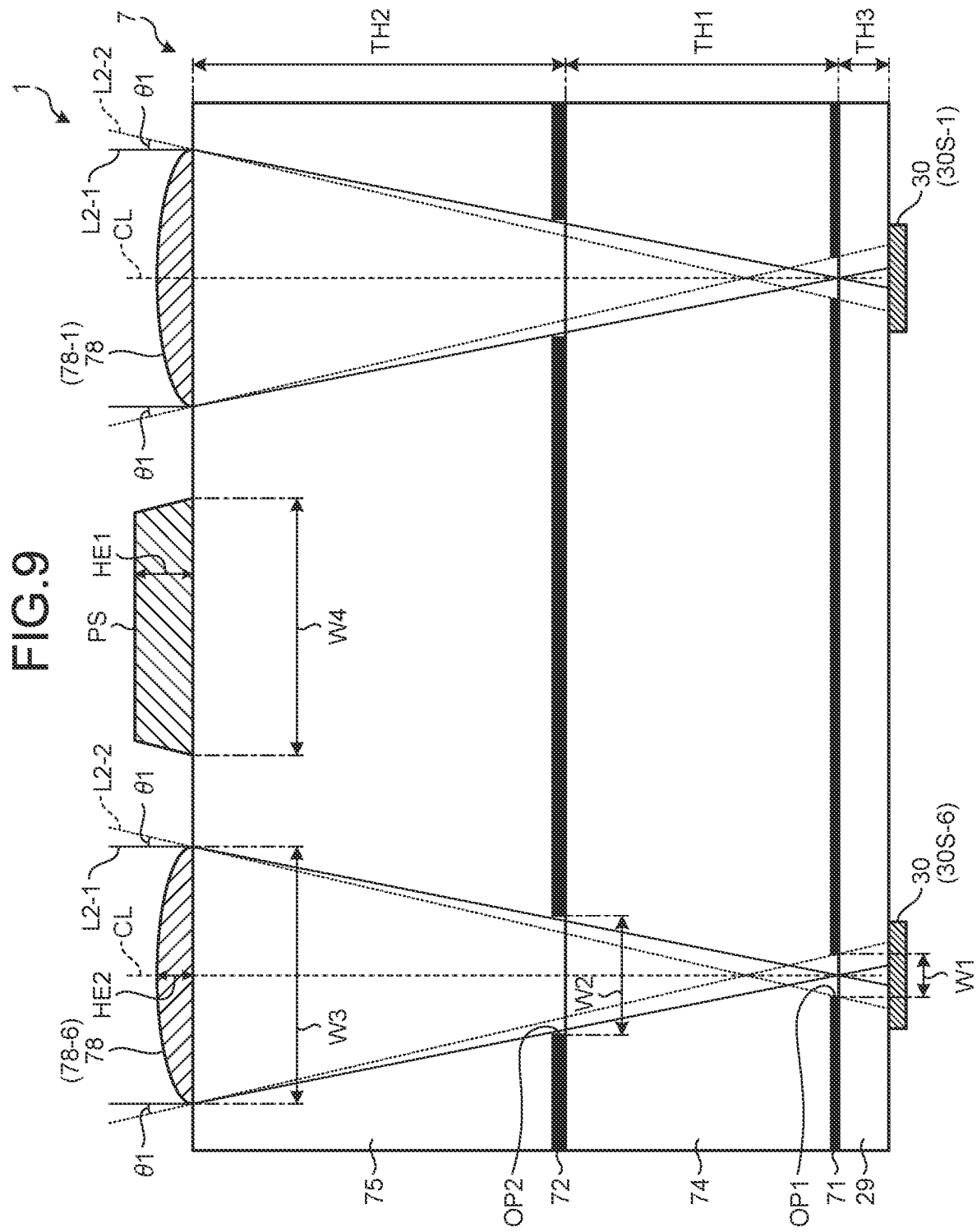
FIG. 9 is a IX-IX' sectional view of FIG. 8.

A lense 78 of the optical filter 7, a first opening OP1 of a first light-blocking layer 71, and a second opening OP2 of a second light-blocking layer 72 illustrated in FIG. 9 are provided so as to overlap each of the partial photodiodes 30S-1, 30S-2, . . . , 30S-8. For ease of viewing, FIG. 5 illustrates only the first openings OP1 among the components of the optical filter 7.

More specifically, the partial photodiodes 30S-1, 30S-2, and 30S-3 are arranged in the second direction Dy. The partial photodiodes 30S-4 and 30S-5 are arranged in the second direction Dy and are adjacent to an element column made up of the partial photodiodes 30S-1, 30S-2, and 30S-3 in the first direction Dx. The partial photodiodes 30S-6, 30S-7, and 30S-8 are arranged in the second direction Dy and are adjacent to an element column made up of the partial photodiodes 30S-4 and 30S-5 in the first direction Dx. The partial photodiodes 30S are arranged at staggered positions in the second direction Dy between the adjacent element columns.

The light L2 is incident on the partial photodiodes 30S-1, 30S-2, . . . , 30S-8 through the optical filter 7. The partial photodiodes 30S-1, 30S-2, . . . , 30S-8 are electrically coupled to one another to serve as one photodiode 30. That is, signals output from the respective partial photodiodes 30S-1, 30S-2, . . . , 30S-8 are integrated into one detection signal Vdet to be output from the photodiode 30. In the following description, the partial photodiodes 30S-1, 30S-2, . . . , 30S-8 will be simply referred to as "partial photodiodes 30S" when need not be distinguished from one another.

Each of the partial photodiodes 30S includes an i-type semiconductor layer 31, the n-type semiconductor layer 32, and the p-type semiconductor layer 33. The i-type semiconductor layer 31 and the n-type semiconductor layer 32 are, for example, of amorphous silicon (a-Si). The p-type semiconductor layer 33 is, for example, of polysilicon (p-Si). The material of each of the semiconductor layers is not limited to those mentioned above and may be, for example, polysilicon or microcrystalline silicon.

The a-Si of the n-type semiconductor layer 32 is doped with impurities to form an n+ region. The p-Si of the p-type semiconductor layer 33 is doped with impurities to form a p+ region. The i-type semiconductor layer 31 is, for example, a non-doped intrinsic semiconductor and has lower conductivity than that of the n-type semiconductor layer 32 and the p-type semiconductor layer 33.

In FIG. 5, a dotted line indicates a first region R1 serving as an effective sensor region in which the p-type semiconductor layer 33 and the i-type semiconductor layer 31 (and the n-type semiconductor layer 32) overlap each other and are directly coupled together. Each of the partial photodiodes 30S includes at least the first region R1. In other words, the first regions R1 are arranged in a triangular lattice pattern in a plan view. Each of the first openings OP1 of the optical filter 7 is provided so as to overlap the first region R1.

Each of the partial photodiodes 30S is formed in a circular shape or a semi-circular shape in the plan view. The shape of the partial photodiode 30S is, however, not limited thereto, and may be, for example, a polygonal shape. The partial photodiodes 30S may have shapes different from one another.

The n-type semiconductor layers 32 of the partial photodiodes 30S-1, 30S-2, and 30S-3 arranged in the second direction Dy are electrically coupled to one another through a joint CA1. The p-type semiconductor layers 33 of the partial photodiodes 30S-1, 30S-2, and 30S-3 are electrically coupled to one another through a joint CA2.

The n-type semiconductor layers 32 (i-type semiconductor layers 31) of the partial photodiodes 30S-4, 30S-5, 30S-6, 30S-7, and 30S-8 are electrically coupled to one another through a base BA1. The p-type semiconductor layers 33 of the partial photodiodes 30S-4, 30S-5, 30S-6, 30S-7, and 30S-8 are electrically coupled to one another through a base BA2. Each of the base BA1 and the base BA2 is formed in a substantially pentagonal shape and is provided, at the apex positions thereof, with the partial photodiodes 30S-4, 30S-5, 30S-6, 30S-7, and 30S-8.

The base BA1 is disposed so as to be separated in the first direction Dx from the i-type semiconductor layers 31 and the n-type semiconductor layers 32 of the partial photodiodes 30S-1, 30S-2, and 30S-3. The base BA2 coupled to the p-type semiconductor layers 33 of the partial photodiodes 30S-4, 30S-5, 30S-6, 30S-7, and 30S-8 is electrically coupled to the p-type semiconductor layers 33 of the partial photodiodes 30S-1, 30S-2, and 30S-3 through a joint CA2a passing below the reset signal line SLrst and the reference signal line SLcom along the first direction Dx. As a result, the partial photodiodes 30S constituting one photodiode 30 are electrically coupled to one another.

A lower conductive layer 35 is provided in a region overlapping the partial photodiodes 30S, the joints CA1 CA2, and CA2a, and the bases BA1 and BA2. Portions of the lower conductive layer 35 overlapping the respective partial photodiodes 30S are formed in a circular shape. However, the portions of the lower conductive layer 35 may have a different shape from that of the partial photodiode 30S. The lower conductive layer 35 only needs to be provided in portions overlapping at least the first regions R1. The lower conductive layer 35 is supplied with the reference potential VCOM that is the same as the potential of the p-type semiconductor layer 33, and thus can reduce the parasitic capacitance between the lower conductive layer 35 and the p-type semiconductor layer 33.

An upper conductive layer 34 electrically couples the n-type semiconductor layers 32 of the partial photodiodes 30S to one another. Specifically, the upper conductive layer 34 is electrically coupled to the n-type semiconductor layers 32 of the respective partial photodiodes 30S-1 and 30S-3 through contact holes H1 and H2 provided in an insulating film 27 (refer to FIG. 6), at positions overlapping the partial photodiodes 30S-1 and 30S-3. A coupling portion 34a of the upper conductive layer 34 is formed in a T-shape so as to overlap the joints CAL CA2, and CA2a and the partial photodiode 30S-2, and is coupled to a coupling portion 34b. The coupling portion 34b of the upper conductive layer 34 is electrically coupled to the n-type semiconductor layer 32 of the base BA1 through a contact hole H3 provided in the insulating film 27 (refer to FIG. 6), at a position overlapping the base BA1.

In addition, the upper conductive layer 34 extends from the coupling portion 34b to a region not overlapping the photodiode 30 and is coupled to a coupling portion 34c. The coupling portion 34c of the upper conductive layer 34 is electrically coupled to the transistors (the reset transistor Mrst and the source follower transistor Msf (refer to FIG. 4)) through a contact hole H4. The upper conductive layer 34 may be provided in any manner, and may be provided, for example, so as to partially cover the partial photodiodes 30S, or so as to fully cover the partial photodiodes 30S.

The reset transistor Mrst, the source follower transistor Msf, and the read transistor Mrd are provided in the region not overlapping the photodiode 30. The source follower transistor Msf and the read transistor Mrd are provided, for example, adjacent to the photodiode 30 in the first direction Dx. The reset transistor Mrst is provided adjacent to the partial photodiode 30S-4 in the second direction Dy and is provided between the partial photodiode 30S-1 and the partial photodiode 30S-6 in the first direction Dx.

One end of a semiconductor layer 61 of the reset transistor Mrst is coupled to the reset signal line SLrst. The other end of the semiconductor layer 61 is coupled to coupling wiring SLcn3 (node N1) through a contact hole H17 (refer to FIG. 7). A portion of the reset signal line SLrst coupled to the semiconductor layer 61 serves as a source electrode, and a portion of the coupling wiring SLcn3 coupled to the semiconductor layer 61 serves as a drain electrode 63 (refer to FIG. 7). The semiconductor layer 61 is formed in a U-shape and intersects the reset control scan line GLrst at two locations. Channel regions are formed in portions of the semiconductor layer 61 overlapping the reset control scan line GLrst, and portions of the reset control scan line GLrst overlapping the semiconductor layer 61 serve as respective gate electrodes 64.

The source follower transistor Msf includes a semiconductor layer 65, a source electrode 66, a drain electrode 67, and a gate electrode 68. One end of the semiconductor layer 65 is coupled to the power supply signal line SLsf through a contact hole H15 (refer to FIG. 6). The other end of the semiconductor layer 65 is coupled to coupling wiring SLcn1 (node N2) through a contact hole H16 (refer to FIG. 6). A portion of the power supply signal line SLsf coupled to the semiconductor layer 65 serves as the drain electrode 67, and a portion of the coupling wiring SLcn1 coupled to the semiconductor layer 65 serves as the source electrode 66.

One end side of the gate electrode 68 extends in the first direction Dx and overlaps the semiconductor layer 65. The other end side of the gate electrode 68 extends in the second direction Dy and is electrically coupled to the coupling wiring SLcn3. This configuration electrically couples the reset transistor Mrst to the gate of the source follower transistor Msf through the coupling wiring SLcn3.

The read transistor Mrd includes a semiconductor layer 81, a source electrode 82, a drain electrode 83, and gate electrodes 84. One end of the semiconductor layer 81 is coupled to the coupling wiring SLcn1. The other end of the semiconductor layer 81 is coupled to coupling wiring SLcn2 branching in the first direction Dx from the output signal line SL. A portion of the coupling wiring SLcn1 coupled to the semiconductor layer 81 serves as the drain electrode 83, and a portion of the coupling wiring SLcn2 coupled to the semiconductor layer 81 serves as the source electrode 82. The two gate electrodes 84 are arranged in the second direction Dy and overlap the semiconductor layer 81. The two gate electrodes 84 are electrically coupled to the read control scan line GLrd through a branch that extends in the second direction Dy and overlaps the power supply signal line SLsf. The above-described configuration couples the source follower transistor Msf and the read transistor Mrd to the output signal line SL.

The output signal line SL is disposed between the position of the source follower transistor Msf and the read transistor Mrd and the position of the partial photodiodes 30S-6, 30S-7, and 30S-8. The output signal line SL is provided in a zig-zag manner along the partial photodiodes 30S-6, 30S-7, and 30S-8.

The reset signal line SLrst and the reference signal line SLcom are disposed between the position of the partial photodiodes 30S-1, 30S-2, and 30S-3 and the position of the partial photodiodes 30S-4 and 30S-5. The reset signal line SLrst and the reference signal line SLcom are provided in a zig-zag manner along the partial photodiodes 30S and intersect the joint CA2a. Since the partial photodiodes 30S-1, 30S-2, and 30S-3 are coupled to the partial photodiodes 30S-4 and 30S-5 through the joint CA2a, the parasitic capacitance of the reset signal line SLrst and the reference signal line SLcom can be smaller than that of a configuration in which the bases BA1 and BA2 are provided so as to overlap the reset signal line SLrst and the reference signal line SLcom.

The reference signal line SLcom is electrically coupled to the lower conductive layer 35 through a contact hole H11. The reference signal line SLcom is also electrically coupled to the joint CA2 through a contact hole H12. This configuration electrically couples the reference signal line SLcom to the p-type semiconductor layer 33 of each of the partial photodiodes 30S.

In the present embodiment, the partial photodiode 30S is provided for each of the first openings OP1 of the optical filter 7. This configuration can reduce portions of the semiconductor layers and wiring layers in a region not overlapping the first openings OP1 as compared with a configuration in which the photodiode 30 is formed of a solid film having, for example, a quadrilateral shape so as to cover the entire detection element 3 in the plan view. Thus, the parasitic capacitance of the photodiode 30 can be reduced.

Since the multiple partial photodiodes 30S are provided, the degree of freedom of the layout of the transistors and the wiring can be increased, and thus, the transistors and the wiring can be provided so as not to overlap the partial photodiodes 30S. Consequently, in the present embodiment, the parasitic capacitance of the photodiode 30 can be smaller than that in a case of providing the photodiode 30 so as to overlap the transistors and the wiring.

The planar structure of the photodiode 30 and the transistors illustrated in FIG. 5 is merely an example and can be changed as appropriate. For example, the number of the partial photodiodes 30S included in each of the photodiodes 30 may be seven or smaller, or nine of larger. The arrangement of the partial photodiodes 30S is not limited to the triangular lattice pattern. The partial photodiodes 30S may be arranged, for example, in a matrix having a row-column configuration.

Figure 7:
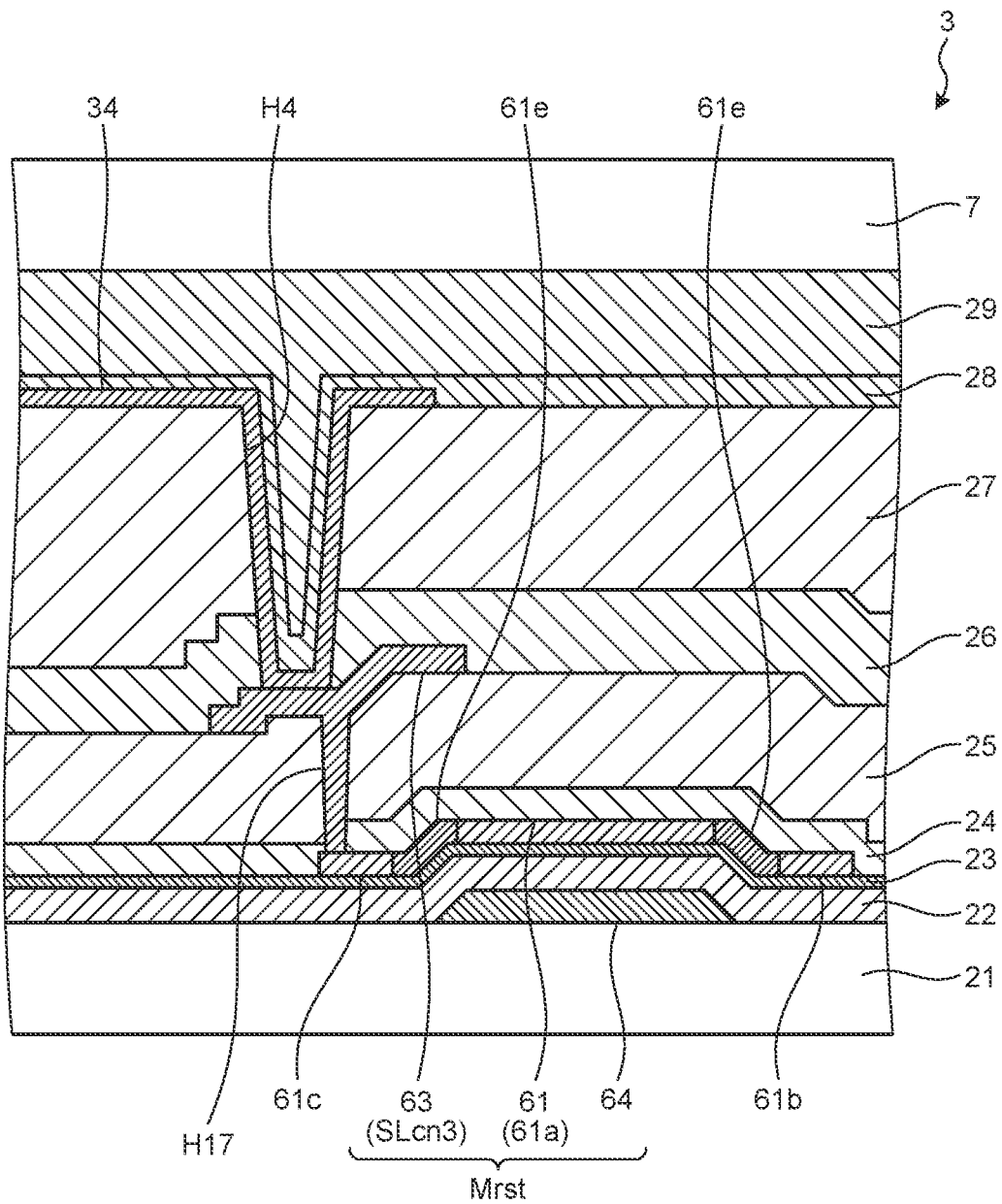
FIG. 7 is a VII-VII' sectional view of FIG. 5.

FIG. 6 is a VI-VI' sectional view of FIG. 5. FIG. 7 is a VII-VII' sectional view of FIG. 5. FIG. 6 illustrates the sectional configuration of the partial photodiodes 30S-1, 30S-2, and 30S-7, and also the sectional configuration of the source follower transistor Msf included in the detection element 3. FIG. 7 illustrates the sectional configuration of the reset transistor Mrst. The read transistor Mrd (not illustrated in FIGS. 6 and 7) has the same sectional configuration as that of the source follower transistor Msf and the reset transistor Mrst.

As illustrated in FIG. 6, the substrate 21 is an insulating substrate, and is formed using, for example, a glass substrate of, for example, quartz or alkali-free glass, or a resin substrate of, for example, polyimide. The gate electrode 68 is provided on the substrate 21. Insulating films 22 and 23 are provided on the substrate 21 so as to cover the gate electrode 68. The insulating films 22 and 23 and insulating films 24, 25, and 26 are inorganic insulating films and are formed of, for example, a silicon oxide ($SiO_2$) or a silicon nitride (SiN).

The semiconductor layer 65 is provided on the insulating film 23. For example, polysilicon is used as the semiconductor layer 65. The semiconductor layer 65 is, however, not limited thereto, and may be formed of, for example, a microcrystalline oxide semiconductor, an amorphous oxide semiconductor, or low-temperature polycrystalline silicon (LTPS). The source follower transistor Msf has a bottom-gate structure in which the gate electrode 68 is provided on the lower side of the semiconductor layer 65. However, the source follower transistor Msf may have a top-gate structure in which the gate electrode 68 is provided on the upper side of the semiconductor layer 65, or a dual-gate structure in which the gate electrode 68 is provided on the upper side or lower side of the semiconductor layer 65.

The semiconductor layer 65 has a channel region 65a, high-concentration impurity regions 65b and 65c, and low-concentration impurity regions 65d and 65e. The channel region 65a is, for example, a non-doped intrinsic semiconductor region or a low-impurity region, and has lower conductivity than that of the high-concentration impurity regions 65b and 65c and the low-concentration impurity regions 65d and 65e. The channel region 65a is provided in a region overlapping the gate electrode 68.

The insulating films 24 and 25 are provided on the insulating film 23 so as to cover the semiconductor layer 65. The source electrode 66 and the drain electrode 67 are provided on the insulating film 25. The source electrode 66 is coupled to the high-concentration impurity region 65b of the semiconductor layer 65 through the contact hole H16. The drain electrode 67 is coupled to the high-concentration impurity region 65c of the semiconductor layer 65 through the contact hole H15. The source electrode 66 and the drain electrode 67 are each formed of, for example, a multilayered film of Ti—Al—Ti or Ti—Al having a multilayered structure of titanium and aluminum.

As illustrated in FIG. 7, the reset transistor Mrst has the same sectional configuration as that of the source follower transistor Msf illustrated in FIG. 6. That is, the drain electrode 63 (coupling wiring SLcn3) is coupled to a high-concentration impurity region 61c of the semiconductor layer 61 through the contact hole H17. The insulating film 26 is provided on the insulating film 25 so as to cover the transistors including the reset transistor Mrst. The insulating film 27 is provided on the insulating film 26. The upper conductive layer 34 is provided on the insulating film 27. The upper conductive layer 34 is electrically coupled to the drain electrode 63 through the contact hole H4 provided through the insulating films 26 and 27.

Referring back to FIG. 6, the following describes the sectional configuration of the photodiode 30. While the partial photodiodes 30S-1, 30S-2, and 30S-7 are described using FIG. 6, the description of the partial photodiodes 30S-1, 30S-2, and 30S-7 can also be applied to the other partial photodiodes 30S. As illustrated in FIG. 6, the lower conductive layer 35 is provided in the same layer as that of the gate electrode 68 on the substrate 21. The insulating films 22 and 23 are provided on the lower conductive layer 35. The photodiode 30 is provided on the insulating film 23. In other words, the lower conductive layer 35 is provided between the substrate 21 and the p-type semiconductor layer 33. The lower conductive layer 35 is formed of the same material as that of the gate electrode 68, and thereby serves as a light-blocking layer. Thus, the lower conductive layer 35 can restrain light from entering the photodiode 30 from the substrate 21 side.

The i-type semiconductor layer 31 is provided between the p-type semiconductor layer 33 and the n-type semiconductor layer 32 in the third direction Dz. In the present embodiment, the p-type semiconductor layer 33, the i-type semiconductor layer 31, and the n-type semiconductor layer 32 are stacked on the insulating film 23 in the order as listed.

Specifically, the p-type semiconductor layer 33 is provided in the same layer as the semiconductor layers 61 and 65 on the insulating film 23. The insulating films 24, 25, and 26 are provided so as to cover the p-type semiconductor layer 33. The insulating films 24 and 25 are provided with a contact hole H13 at a position overlapping the p-type semiconductor layer 33. The insulating film 26 is provided on the insulating film 25 and covers side surfaces of the insulating films 24 and 25 constituting an inner wall of the contact hole H13. The insulating film 26 is provided with a contact hole H14 at a position overlapping the p-type semiconductor layer 33.

The i-type semiconductor layer 31 is provided on the insulating film 26, and is coupled to the p-type semiconductor layer 33 through the contact hole H14 penetrating from the insulating film 24 to the insulating film 26. The n-type semiconductor layer 32 is provided on the i-type semiconductor layer 31.

In more detail, the photodiode 30 has the first regions R1, second regions R2 and a third region R3. The first regions R1 are provided corresponding to the partial photodiodes 30S. In each of the first regions R1, the p-type semiconductor layer 33, the i-type semiconductor layer 31, and the n-type semiconductor layer 32 are stacked so as to be directly in contact with one another. In other words, the first region R1 is a region defined by a bottom surface of the contact hole H14.

The second regions R2 are provided between the first regions R1. In each of the second regions R2, at least the p-type semiconductor layer 33 and the i-type semiconductor layer 31 are stacked so as to be separated from each other in a direction orthogonal to the substrate 21 (in the third direction Dz). More specifically, the second region R2 includes the insulating films 24, 25, and 26 provided between the p-type semiconductor layer 33 and the i-type semiconductor layer 31. The second region R2 is, however, not limited thereto, and may include one or two layers of insulating films, or four or more layers of insulating films between the p-type semiconductor layer 33 and the i-type semiconductor layer 31.

In the second region R2, the thickness of the insulating films 24, 25, and 26 (the total thickness of a thickness ti1 of the insulating films 24 and 25 and a thickness ti2 of the insulating film 26) provided between the p-type semiconductor layer 33 and the i-type semiconductor layer 31 is greater than a thickness ti3 of the i-type semiconductor layer 31. The thickness ti1 of the insulating films 24 and 25 is greater than the thickness ti2 of the insulating film 26. The distance between the p-type semiconductor layer 33 and the n-type semiconductor layer 32 of the second region R2 is greater than the distance between the p-type semiconductor layer 33 and the n-type semiconductor layer 32 of the first region R1. The thickness relation between the i-type semiconductor layer 31 and the insulating films 24, 25, and 26 is not limited to the above-described relation, and a configuration may be employed in which the total thickness of the three layers of the insulating films 24, 25, and 26 is less than the thickness of the i-type semiconductor layer 31. In the second region R2, the insulating films 24, 25, and 26 having a predetermined thickness need to be present between the i-type semiconductor layer 31 (and/or the n-type semiconductor layer 32) and the p-type semiconductor layer 33. However, various thicknesses can be employed as the thickness of the insulating films 24, 25, and 26.

The second regions R2 are provided around the first regions R1 in the plan view and include the joints CA1, CA2 and the bases BA1 and BA2. The partial photodiodes 30S-1, 30S-2, and 30S-3 (FIG. 6 does not illustrate the partial photodiode 30S-3) are coupled to one another through the joint CA1 including the i-type semiconductor layer 31 and the n-type semiconductor layer 32 stacked on the insulating film 26 and the joint CA2 including the p-type semiconductor layer 33 formed on the insulating film 23. In the same manner, the partial photodiodes 30S-4 to 30S-8 (refer to FIG. 5) are coupled to one another through the base BA1 including the i-type semiconductor layer 31 and the n-type semiconductor layer 32 stacked on the insulating film 26 and the base BA2 including the p-type semiconductor layer 33 formed on the insulating film 23.

With the above-described configuration, the capacitance per unit area generated between the i-type semiconductor layer 31 and the p-type semiconductor layer 33 in the second regions R2 is smaller than the capacitance per unit area generated between the i-type semiconductor layer 31 and the p-type semiconductor layer 33 in the first regions R1. Consequently, the capacitance Cs of each of the photodiodes 30 (refer to FIG. 4) can be reduced as compared with the configuration in which the photodiode 30 is formed of a solid film having, for example, a quadrilateral shape so as to cover the entire detection element 3 in the plan view, that is, a configuration in which the i-type semiconductor layer 31 and the n-type semiconductor layer 32 of the second regions R2 are provided in the same layer the first regions R1. As a result, the detection sensitivity of the detection device 1 can be improved. The capacitance generated between the i-type semiconductor layer 31 and the p-type semiconductor layer 33 has been described above. However, in view of the fact that the i-type semiconductor layer 31 directly contacts the n-type semiconductor layer 32, and the p-type semiconductor layer 33 faces the n-type semiconductor layer 32 with the i-type semiconductor layer 31 interposed therebetween, the above description of the capacitance can naturally be replaced with a description of capacitance between the p-type semiconductor layer 33 and the n-type semiconductor layer 32.

In the third region R3, the p-type semiconductor layer 33 is provided, and the i-type semiconductor layer 31 and the n-type semiconductor layer 32 are provided so as not to overlap the p-type semiconductor layer 33. The third region R3 is a region provided with the joint CA2a constituted by the p-type semiconductor layer 33 described above. That is, in the third region R3, the adjacent second regions R2 are coupled to each other at least through the p-type semiconductor layer 33. In addition, in the third region R3, the insulating films 24 and 25 are provided on the p-type semiconductor layer 33, and the reset signal line SLrst and the reference signal line SLcom are provided on the insulating films 24 and 25 provided on the p-type semiconductor layer 33. In other words, a gap SP of the i-type semiconductor layer 31 and the n-type semiconductor layer 32 is provided above the reset signal line SLrst and the reference signal line SLcom. Such a configuration can ensure insulation between each of the signal lines and the n-type semiconductor layer 32 as compared with a configuration in which the i-type semiconductor layer 31 and the n-type semiconductor layer 32 are provided so as to overlap the reset signal line SLrst and the reference signal line SLcom.

The insulating film 27 is provided above the insulating film 26 so as to cover the photodiode 30. The insulating film 27 is provided so as to be directly in contact with the photodiode 30 and the insulating film 26. The insulating film 27 is formed of an organic material such as a photosensitive acrylic resin. The insulating film 27 is thicker than the insulating film 26. The thickness relation between these insulating films may be reversed. The insulating film 27 has a better step coverage property than that of inorganic insulating materials, and is provided so as to cover side surfaces of the i-type semiconductor layer 31 and the n-type semiconductor layer 32.

The upper conductive layer 34 is provided above the insulating film 27. The upper conductive layer 34 is formed of, for example, a light-transmitting conductive material such as indium tin oxide (ITO). The upper conductive layer 34 is provided along a surface of the insulating film 27 and is coupled to the n-type semiconductor layer 32 through the contact holes H1 and H3 provided in the insulating film 27. With this configuration, signals (photocurrents Ip) output from the respective partial photodiodes 30S are integrated in the common upper conductive layer 34 and are output as one detection signal Vdet through the source follower transistor Msf and the read transistor Mrd (refer to FIG. 4).

The contact hole H1 is provided at a position overlapping the first region R1. The n-type semiconductor layer 32 of the partial photodiode 30S-1 is coupled to the upper conductive layer 34 on a bottom surface of the contact hole H1. Neither the contact hole H1 nor the contact hole H3 is formed in the first regions R1 of the partial photodiodes 30S-2 and 30S-7. The contact hole H3 is provided at a position overlapping the second region R2. The width of the first region R1 of the partial photodiode 30S-1 is greater than the width of the first region R1 of each of the partial photodiodes 30S-2 and 30S-7. However, since the upper conductive layer 34 only needs to be coupled to the n-type semiconductor layer 32 at any location, the first regions R1 of the partial photodiodes 30S may be formed to have the same width and shape.

An insulating film 28 is provided on the insulating film 27 so as to cover the upper conductive layer 34. The insulating film 28 is an inorganic insulating film. The insulating film 28 is provided as a protective layer for restraining water from entering the photodiode 30.

A protective film 29 is provided on the insulating film 28. The protective film 29 is an organic protective film. The protective film 29 is formed so as to planarize a surface of the detection device 1.

In the present embodiment, the p-type semiconductor layer 33 and the lower conductive layer 35 of the photodiode 30 are provided in the same layers as those of the transistors. Therefore, the manufacturing process can be simpler than in a case where the photodiode 30 is formed in layers different from those of the transistors.

The sectional configuration of the photodiode 30 illustrated in FIG. 6 is merely an example. The sectional configuration is not limited to this example. For example, the photodiode 30 may be provided in layers different from those of the transistors. The stacking order of the p-type semiconductor layer 33, the i-type semiconductor layer 31, and the n-type semiconductor layer 32 is also not limited to that of FIG. 6. The stacking may be made in the order of the n-type semiconductor layer 32, the i-type semiconductor layer 31, and the p-type semiconductor layer 33.

Figure 8:
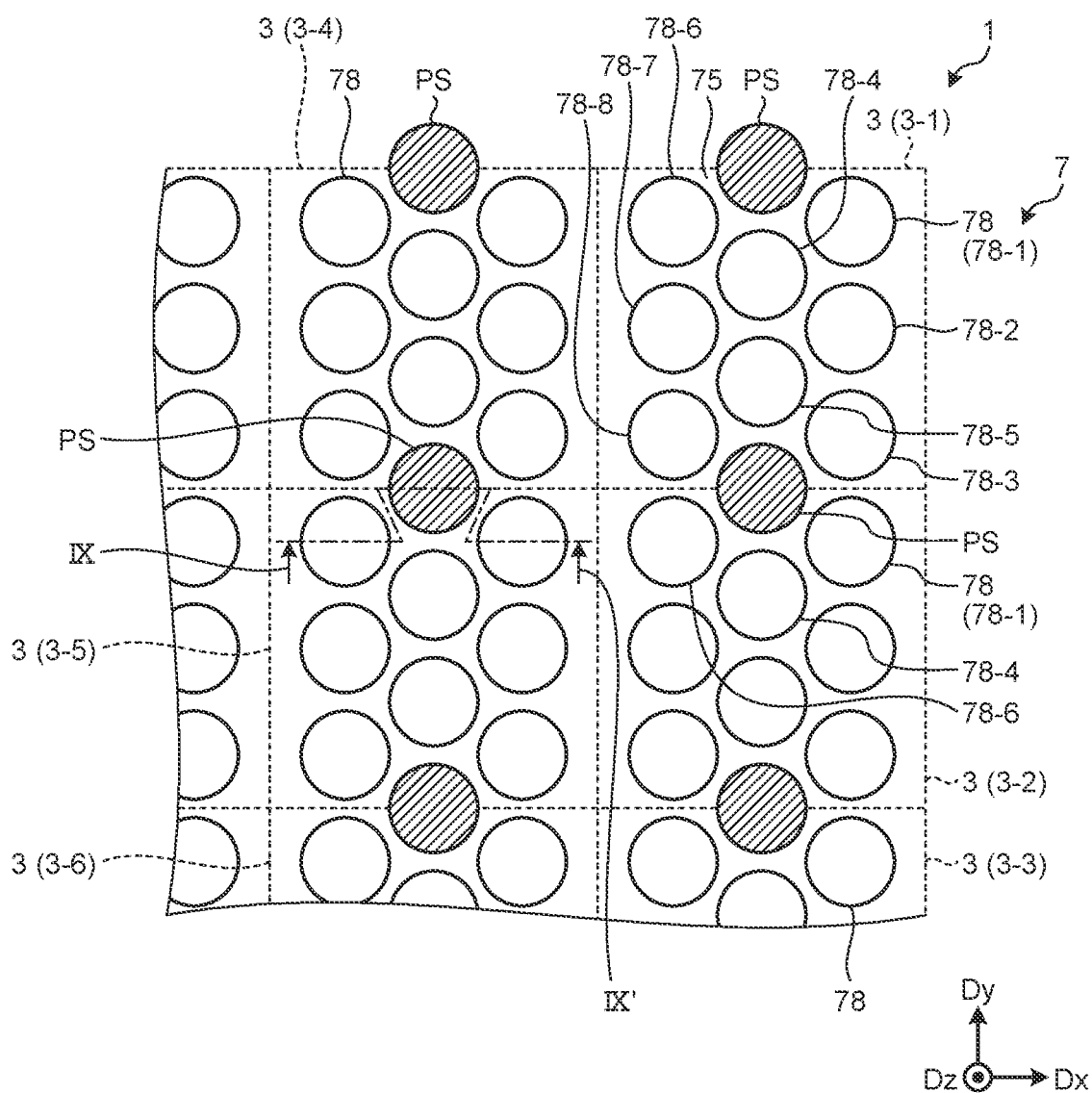
FIG. 8 is a plan view illustrating a configuration example of an optical filter and projections.

The following describes a configuration example of the optical filter 7. FIG. 8 is a plan view illustrating a configuration example of the optical filter and projections. FIG. 9 is a IX-IX' sectional view of FIG. 8. For ease of viewing, FIG. 8 illustrates projections PS with oblique lines added thereto. FIG. 9 illustrates a simplified configuration of the array substrate 2 and schematically illustrates the photodiode 30 (partial photodiodes 30S-1 and 30S-6) and the protective film 29 covering the photodiode 30.

The optical filter 7 is an optical element that transmits, toward the photodiode 30, a component of the light L2 reflected by an object to be detected such as the finger Fg that travels in the third direction Dz, and blocks components of the light L2 that travels in oblique directions. The optical filter 7 is also called collimator apertures or a collimator.

As illustrated in FIG. 8, the optical filter 7 is provided so as to cover the detection elements 3 (photodiodes 30) arranged in a matrix having a row-column configuration. The optical filter 7 includes a first light-transmitting resin layer 74 (refer to FIG. 9) and a second light-transmitting resin layer 75 that cover the detection elements 3, and includes the lenses 78 provided for each of the detection elements 3. The detection device 1 further includes the projections PS provided between the adjacent lenses 78.

The lenses 78 are arranged for each of the detection elements 3. In the example illustrated in FIG. 8, eight lenses 78-1, 78-2, . . . , 78-8 are provided for each of the detection elements 3. The lenses 78-1, 78-2, . . . , 78-8 are arranged in a triangular lattice pattern and are provided so as to overlap the partial photodiodes 30S-1, 30S-2, . . . , 30S-8, respectively.

The number of the lenses 78 arranged in each of the detection elements 3 may be seven or smaller, or nine of larger so as to match the number of the partial photodiodes 30S. The arrangement of the lenses 78 can also be changed as appropriate depending on the configuration of the photodiodes 30.

The projections PS are used as spacers when the array substrate 2 is stacked together with another substrate in the manufacturing process of the detection device 1. A method for manufacturing the detection device 1 will be described later. Each of the projections PS has the same shape as that of the lens 78 in the plan view and has a circular shape. Each of the projections PS is provided so as to be surrounded by six of the lenses 78. More specifically, the projection PS is disposed between the lens 78-4 and the lens 78-5 in the second direction Dy, and the projection PS is disposed between the lenses 78-1 and 78-3 and the lenses 78-6 and 78-8 in the first direction Dx. The projections PS are arranged with the lenses 78 in triangular lattice patterns and are efficiently arranged in spaces between the lenses 78.

The projection PS is provided at a boundary between the detection elements 3 adjacent in the second direction Dy. In other words, the projection PS is provided between the photodiodes 30 adjacent in the second direction Dy in the plan view. One projection PS is provided at each of the boundaries between detection elements 3-1, 3-2, and 3-3 arranged in the second direction Dy. One projection PS is provided at each of the boundaries between detection elements 3-4, 3-5, and 3-6 arranged adjacent to the detection elements 3-1, 3-2, and 3-3. The number of the projections PS is smaller than the number of the lenses 78. The projections PS are provided so as not to overlap the partial photodiodes 30S of the photodiode 30.

The arrangement and the number of the projections PS can, however, be changed as appropriate. For example, the projection PS may be provided at a boundary between the detection elements 3 adjacent in the first direction Dx. Although each of the detection elements 3 is provided with the projection PS, one or more detection elements 3 not provided with the projection PS may be present. The projection PS may have a different shape and size from those of the lens 78.

As illustrated in FIG. 9, the optical filter 7 includes the first light-blocking layer 71, the second light-blocking layer 72, the first light-transmitting resin layer 74, the second light-transmitting resin layer 75, and the lenses 78. In the present embodiment, the first light-blocking layer 71, the first light-transmitting resin layer 74, the second light-blocking layer 72, the second light-transmitting resin layer 75, and the lenses 78 are stacked on the protective film 29 in the order as listed. The projections PS are integrally formed with the optical filter 7 and are provided in the same layer as that of the lenses 78 on the second light-transmitting resin layer 75.

The lenses 78 are respectively provided in regions overlapping the partial photodiodes 30S of the photodiode 30. Each lens 78 is a convex lens. An optical axis CL of the lens 78 is provided in a direction parallel to the third direction Dz and intersects the partial photodiode 30S. The lenses 78 are provided on the second light-transmitting resin layer 75 so as to be directly in contact therewith. In other words, the second light-transmitting resin layer 75 is provided between the second light-blocking layer 72 and the lenses 78. In the present embodiment, no light-blocking layer or the like is provided on the second light-transmitting resin layer 75 between the adjacent lenses 78.

The first light-blocking layer 71 and the second light-blocking layer 72 are provided between the photodiode 30 and the lenses 78 in the third direction Dz. The first light-blocking layer 71 is provided with the first openings OP1 in regions overlapping the photodiode 30. The second light-blocking layer 72 is provided with the second openings OP2 in regions overlapping the photodiode 30. The lenses 78 are provided so as to overlap the first openings OP1 and the second openings OP2. In other words, the first openings OP1 and the second openings OP2 are formed in regions overlapping the optical axes CL.

The first light-blocking layer 71 is formed of, for example, a metal material such as molybdenum (Mo). This material allows the first light-blocking layer 71 to reflect the components of the light L2 traveling in the oblique directions other than the light L2 passing through the first opening OP1.

The second light-blocking layer 72 is formed of, for example, a resin material colored in black. With this configuration, the second light-blocking layer 72 serves as a light-absorbing layer that absorbs the components of the light L2 traveling in the oblique directions other than the light L2 passing through the second openings OP2. For example, the second light-blocking layer 72 can absorb light reflected by the first light-blocking layer 71 and extraneous light incident between the adjacent lenses 78.

In the present embodiment, the width decreases in the order of a width W3 of the lens 78 in the first direction Dx, a width W2 of the second opening OP2 in the first direction Dx, and the width W1 of the first opening OP1 in the first direction Dx. The width W1 of the first opening OP1 in the first direction Dx is less than the width of the partial photodiode 30S of the photodiode 30 in the first direction Dx.

A thickness TH2 of the second light-transmitting resin layer 75 illustrated in FIG. 9 is set to be greater than a thickness TH1 of the first light-transmitting resin layer 74. The thickness TH1 of the first light-transmitting resin layer 74 and the thickness TH2 of the second light-transmitting resin layer 75 are greater than a thickness TH3 of the protective film 29 of the sensor substrate 5.

With the above-described configuration, light L2-1 traveling in the third direction Dz among beams of the light L2 reflected by the object to be detected such as the finger Fg is condensed by the lens 78, and passes through the second opening OP2 and the first opening OP1 to enter the photodiode 30. Light L2-2 tilted by an angle θ1 with respect to the third direction Dz also passes through the second opening OP2 and the first opening OP1 to enter the photodiode 30.

The projections PS are provided at positions overlapping portions of the first light-blocking layer 71 not provided with the first openings OP1 and portions of the second light-blocking layer 72 not provided with the second openings OP2. In other words, the projections PS overlap neither the first openings OP1 nor the second openings OP2, and the light L2 having passed through the projections PS is blocked by the first light-blocking layer 71 and the second light-blocking layer 72. That is, although the detection device 1 has the configuration provided with the projections PS, the detection device 1 can restrain the detection accuracy from decreasing.

A width W4 (diameter) in the first direction Dx of the projection PS is equal to a width W3 (diameter) in the first direction Dx of the lens 78. In the third direction Dz, a height HE1 of the projection PS is greater than a height HE2 of the lens 78. In other words, when viewed from a first principal surface MS1 of the substrate 21 (refer to FIG. 12), the top of the projection PS is provided at a position higher than the top of the lens 78. The overall length from the top to the bottom of the projection PS is greater than the overall length from the top to the bottom of the lens 78. The height HE1 of the projection PS is in a range from 1.0 μm to 5.5 μm, and is, for example, approximately or exactly 3.75 μm. The height HE2 of the lens 78 is in a range from 0.5 μm to 5.0 μm, and is, for example, approximately or exactly 3.0 μm. The projection PS is formed of a resin material and is patterned into a columnar shape using a photolithography technique. In FIG. 9, the upper surface of the projection PS is formed flat. FIG. 9 is, however, a sectional view merely schematically illustrated. The upper surface of the projection PS may have a curved surface in the same manner as the lens 78.

The optical filter 7 is integrally formed with the array substrate 2. That is, the first light-blocking layer 71 of the optical filter 7 is provided on the protective film 29 so as to be directly in contact therewith, and any member such as an adhesive layer is not provided between the first light-blocking layer 71 and the protective film 29. The optical filter 7 is directly formed as a film on the array substrate 2 and is formed by being subjected to a process such as patterning. Consequently, the positional accuracy of the first opening OP1, the second opening OP2, and the lens 78 of the optical filter 7 with respect to the photodiode 30 can be improved as compared with the case of attaching the optical filter 7 as a separate component to the array substrate 2.

The configuration of the optical filter 7 illustrated in FIG. 9 is merely an example and can be changed as appropriate. For example, the optical filter 7 may be formed separately from the array substrate 2. The relations between the widths W1, W2, and W3 and between the thicknesses TH1, TH2, and TH3 may be changed as appropriate depending on required optical characteristics. The optical filter 7 is not limited to the configuration provided with the first light-blocking layer 71 and the second light-blocking layer 72 and may be provided with one layer of the first light-blocking layer 71 and one layer of the first light-transmitting resin layer 74.

Figure 10:
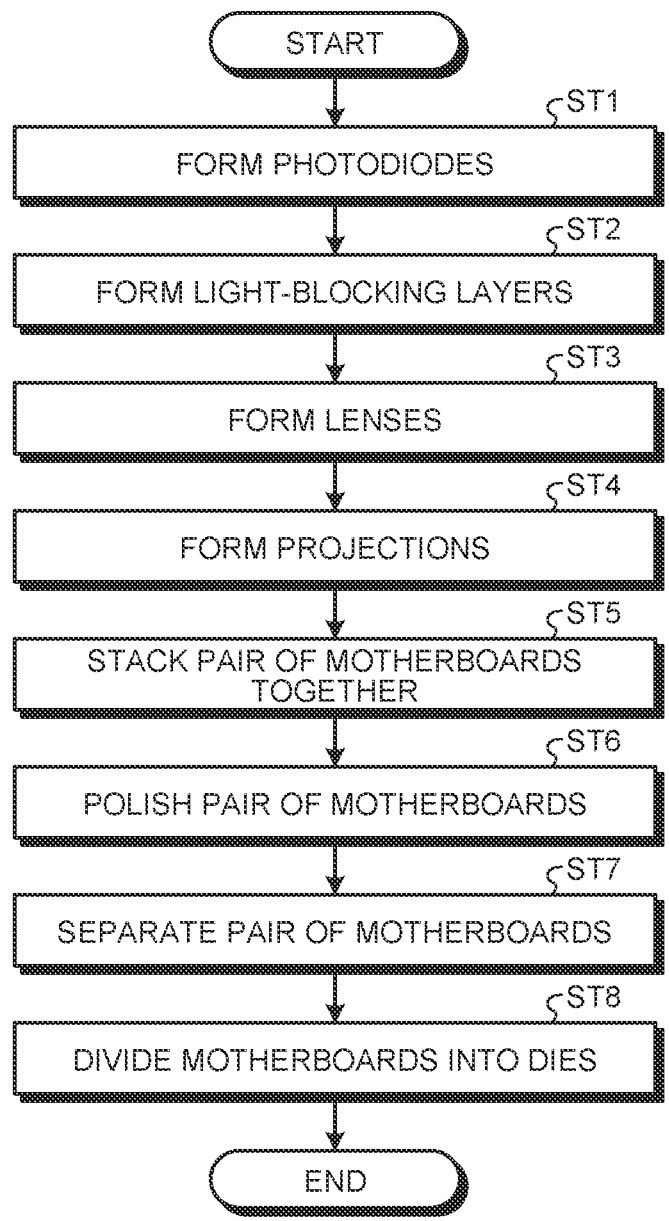
FIG. 10 is a flowchart for explaining a method for manufacturing the detection device according to the embodiment.
Figure 11:
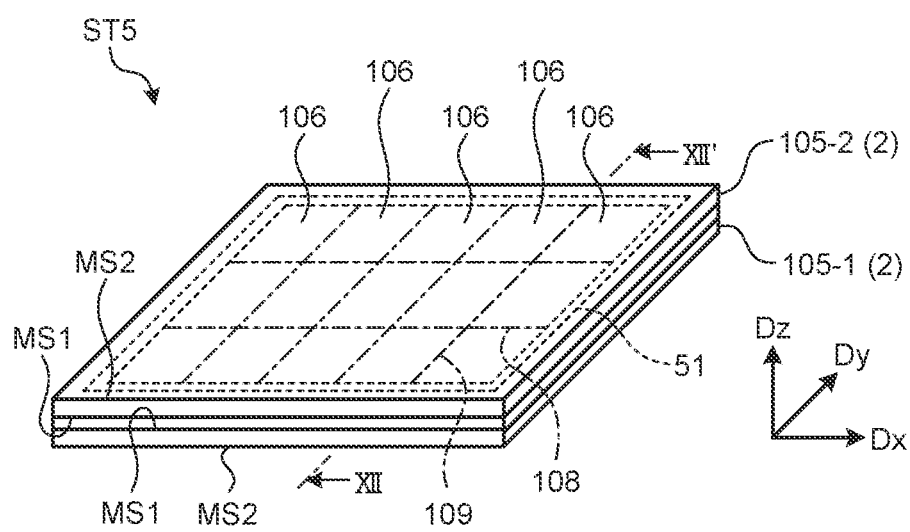
FIG. 11 is a perspective view schematically illustrating a pair of bonded motherboards.
Figure 12:
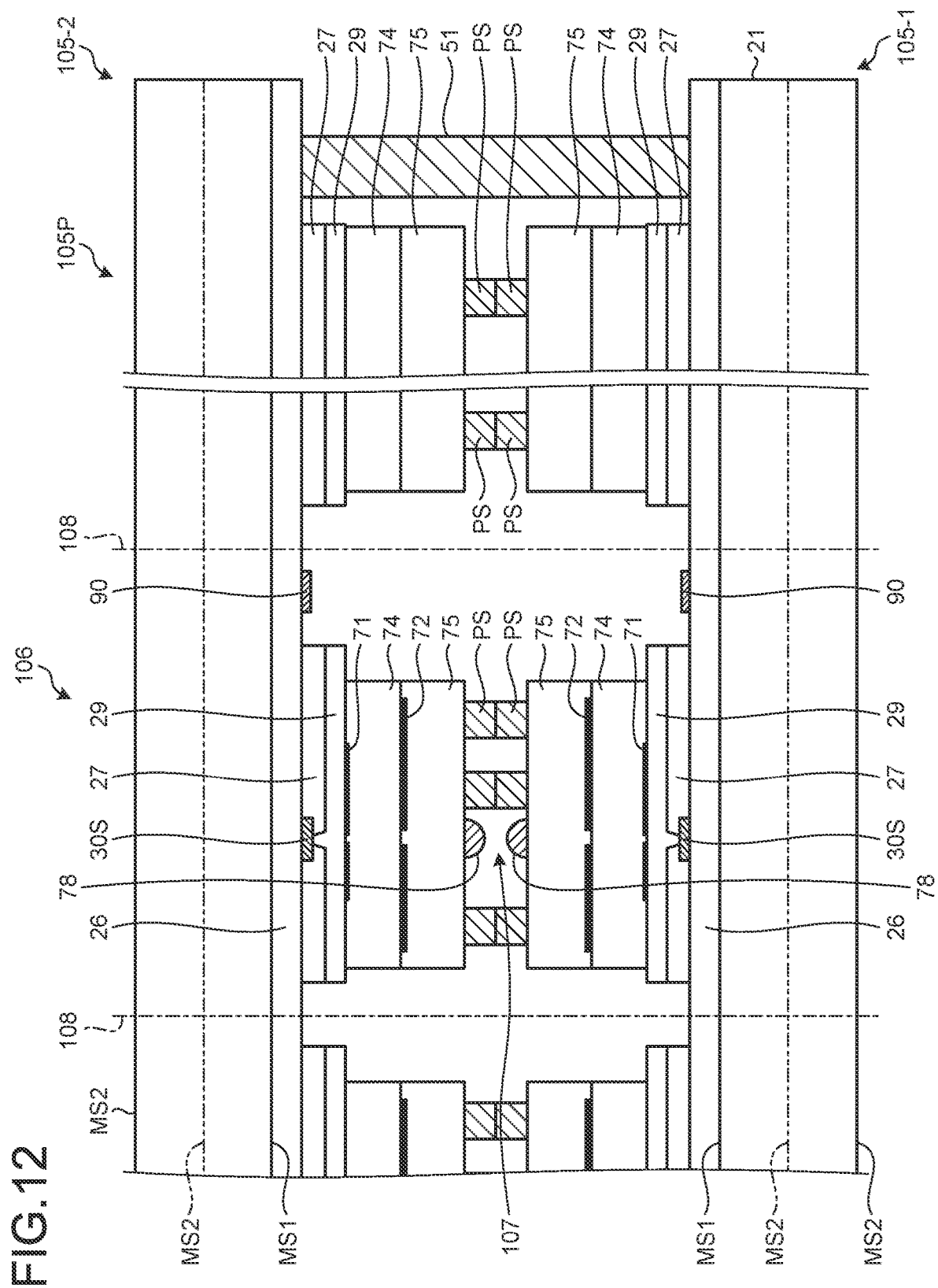
FIG. 12 is a XII-XII' sectional view of FIG. 11.

The following describes the method for manufacturing the detection device 1. FIG. 10 is a flowchart for explaining the method for manufacturing the detection device according to the embodiment. FIG. 11 is a perspective view schematically illustrating a pair of bonded motherboards. FIG. 12 is a XII-XII' sectional view of FIG. 11. For ease of viewing, FIG. 12 does not illustrate a detailed configuration of the array substrate 2 and illustrates an example of two of the partial photodiodes 30S and two of the lenses 78 arranged so as to face each other.

As illustrated in FIG. 10, manufacturing equipment forms the photodiodes 30 (Step ST1). Specifically, a pair of motherboards 105 (refer to FIG. 11) are prepared, and after various transistors and various types of wiring are formed on each of the motherboards 105, the photodiodes 30 each including the partial photodiodes 30S are formed. As illustrated in FIG. 11, a plurality of sensor regions 106 are arranged on the motherboard 105. The sensor regions 106 are regions each to be formed as the detection device 1 (array substrate 2) when being divided into dies along dividing lines 108 and 109. That is, a multilayered structure from the substrate 21 to the optical filter 7 and the projections PS is formed on the motherboard 105, which includes the transistors, the various types of wiring, and the photodiodes 30.

The manufacturing equipment then forms the first light-blocking layer 71 and the second light-blocking layer 72 above the protective film 29 covering the photodiodes 30 (Step ST2). Specifically, the manufacturing equipment forms the first light-blocking layer 71 on the protective film 29 and patterns the first openings OP1 at positions overlapping the partial photodiodes 30S. Then, the first light-transmitting resin layer 74 is applied to be formed on the first light-blocking layer 71. The second light-blocking layer 72 is formed on the first light-transmitting resin layer 74, and the second openings OP2 are patterned at positions overlapping the partial photodiodes 30S. The second light-transmitting resin layer 75 is formed on the second light-blocking layer 72.

The manufacturing equipment then forms the lenses 78 (Step ST3). The lenses 78 having curved surface shapes are formed by applying a resin material on the second light-transmitting resin layer 75, performing patterning using the photolithography technique, and performing baking.

Then, the projections PS are formed between the adjacent lenses 78 (Step ST4). The resin material is applied on the second light-transmitting resin layer 75 to form the projections PS having a thickness greater than that of the lenses 78. The projections PS are patterned using the photolithography technique and are baked to be hardened. The projections PS are preferably formed using a material different from that of the lenses 78 but may be formed using the same material as that of the lenses 78. For example, a transparent acrylic resin or siloxane resin is used as the material of the lenses 78. For example, a transparent acrylic resin, epoxy resin, or polyimide is used as the material of the projections PS.

Then, the pair of motherboards 105 are stacked together (Step ST5). Specifically, as illustrated in FIGS. 11 and 12, the manufacturing equipment bonds the pair of motherboards 105 together in such a manner that the first principal surfaces MS1 of the substrates 21 of the pair of motherboards 105, on which the photodiodes 30 (FIG. 12 illustrates one of the partial photodiodes 30S), the lenses 78, and the projections PS are formed, face each other. This operation causes the projections PS provided on the surfaces of the second light-transmitting resin layers 75 to be disposed between the first principal surfaces MS1 of the pair of substrates 21. A second principal surface MS2 of each of the pair of substrates 21 is directed outward in the third direction Dz.

As illustrated in FIG. 12, the pair of motherboards 105 are stacked together such that the projections PS of one motherboard 105-1 abut on the projections PS of the other motherboard 105-2. As a result, a gap 107 is formed between the first principal surfaces MS1 of the pair of substrates 21, and thus, the lenses 78 facing each other can be restrained from contacting each other. Terminals 90 provided on the first principal surfaces MS1 of the pair of substrates 21 are also disposed facing with a gap interposed therebetween. Each of the terminals 90 is a terminal for electrically coupling the array substrate 2 to the external wiring substrate 110 (refer to FIG. 2). The pair of motherboards 105 are bonded together by a seal 51 provided in a peripheral region 105P. The seal 51 is provided so as to surround the sensor regions 106, and seals a gap between the pair of substrates 21.

In FIG. 12, the pair of motherboards 105 are stacked together such that the positions of the projections PS of the one motherboard 105-1 fully matches the positions of the projections PS of the other motherboard 105-2. However, the present disclosure is not limited to this configuration. The projections PS of the one motherboard 105-1 only need to be provided so as to at least partially overlap the projections PS of the other motherboard 105-2.

Referring back to FIG. 10, the manufacturing equipment then polishes the second principal surface MS2 of each of the pair of substrates 21 in the state where the pair of motherboards 105 are stacked together (Step ST6). Chemical polishing is employed to polish the substrates 21. Mechanical polishing may be employed to polish the substrates 21. The second principal surface MS2 side of each of the pair of substrates 21 is removed from the substrate 21 having the original thickness (at the second principal surface MS2 indicated by a solid line in FIG. 12), and thus, the substrate 21 is thinned to the second principal surface MS2 indicated by a long dashed double-short dashed line in FIG. 12. In this manner, in the present embodiment, one operation of the polishing process can simultaneously polish the pair of substrates 21.

Accordingly, the method for manufacturing the detection device 1 according to the present embodiment can reduce the manufacturing cost as compared with a case where the optical filter 7 side of the single substrate 21 (motherboard 105) is bonded onto another supporting substrate, and the substrate 21 is polished. In addition, since the polishing process can be performed in the state where the lenses 78 of the optical filter 7 do not contact other members, the substrate 21 can be thinned while reducing damage to the lenses 78.

The manufacturing equipment then separates the pair of motherboards 105 (Step ST7). Specifically, the seal 51 is removed by cutting an outer edge portion of the pair of motherboards 105 along the inside of the seal 51. Through performing this operation, a portion of the pair of motherboards 105 in which the sensor regions 106 are formed is separated from the seal 51, and thus, the pair of motherboards 105 can be separated.

In the present embodiment, since the projections PS form the gap 107 between the pair of substrates 21, air easily enters the gap 107 when the pair of motherboards 105 are caused to be separated, and thereby, a separation process can be easily performed. That is, even when the substrates 21 have been thinned by the polishing process, the separation process of the pair of motherboards 105 can be easily performed, and the substrates 21 can be restrained from being damaged. Thus, the method for manufacturing the detection device 1 can thin the detection device 1 while restraining the manufacturing cost from increasing.

Figure 13:
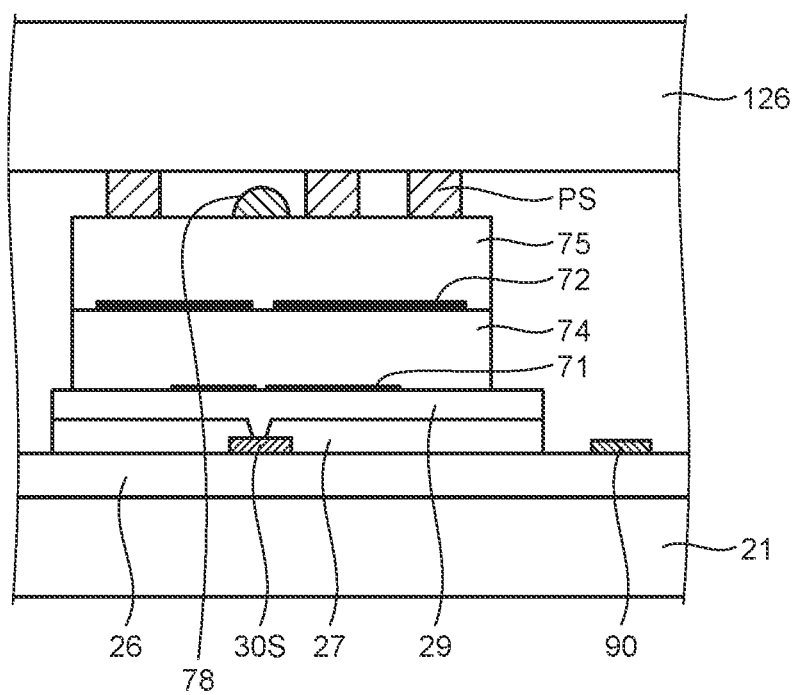
FIG. 13 is a sectional view schematically illustrating a configuration of an array substrate bonded to a display panel.

The manufacturing equipment then divides each of the motherboards 105 (105-1 and 105-2) into dies (Step ST8). Specifically, the motherboards 105 are divided into the sensor regions 106 along the dividing lines 108 and 109 illustrated in FIG. 11 to form the array substrates 2. Then, the detection device 1 can be manufactured by bonding the cover member 122 and the display panel 126 to each of the array substrates 2 as required. FIG. 13 is a sectional view schematically illustrating a configuration of the array substrate bonded to the display panel. As illustrated in FIG. 13, the substrate 21 is bonded to the display panel 126 such that the projections PS abut on the lower surface of the display panel 126. This configuration restrains the lenses 78 in the detection device 1 from contacting the display panel 126, thereby restraining the lenses 78 from being damaged.

The method for manufacturing the detection device 1 illustrated in FIGS. 10 to 12 is schematically illustrated for facilitating understanding of the description, and may be changed as appropriate. For example, while the sensor regions 106 of the motherboards 105 are arranged in three rows and five columns, 16 or more sensor regions 106 may actually be provided. Although FIG. 12 illustrates the terminal 90 in the same layer as that of the partial photodiode 30S, the terminal 90 may be formed in a layer different from that of the partial photodiode 30S.

As described above, the detection device 1 of the present embodiment includes the substrate 21, the photodiodes 30 arranged on the first principal surface MS1 of the substrate 21, the protective film 29 covering the photodiodes 30, the lenses 78 provided for each of the photodiodes 30 so as to face the photodiode 30 with the protective film 29 interposed therebetween, and the projections PS provided between the adjacent lenses 78. When viewed from the first principal surface MS1, the top of the projection PS is provided at the position higher than the top of the lens 78.

The method for manufacturing the detection device 1 according to the present embodiment includes the process of stacking the pair of substrates 21 together, with the first principal surfaces MS1 of the pair of substrates 21, on which the projections PS having the height HE1 in the direction orthogonal to the substrates 21 greater than the height HE2 of the lenses 78, facing each other (Step ST5) and the process of polishing the second principal surface MS2 on the opposite side of the first principal surface MS1 of each of the pair of substrates 21 in the state where the substrates 21 are stacked together (Step ST6). In the process of stacking the pair of substrates 21 together, the projections PS of one of the detection devices 1 abut on portions of the other of the detection devices 1 facing the one detection device, and the lenses 78 of the detection devices 1 face each other without contacting each other.

Figure 14:
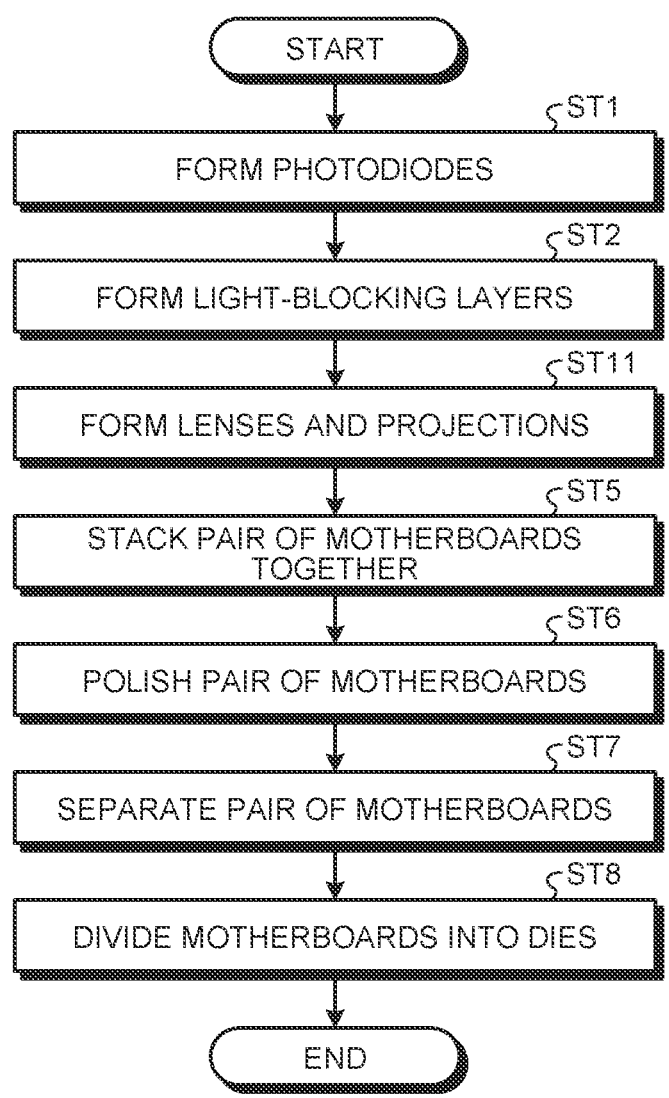
FIG. 14 is a flowchart for explaining a method for manufacturing the detection device according a fourth modification of the embodiment.

FIG. 14 is a flowchart for explaining a method for manufacturing the detection device according a fourth modification of the embodiment. In the following description, the same components as those described in the above-described embodiment are denoted by the same reference numerals, and the description thereof will not be repeated.

As illustrated in FIG. 14, in the fourth modification, the manufacturing equipment forms the lenses 78 and the projections PS in the same process (Step ST11). The lenses 78 and the projections PS are formed by applying a resin material on the second light-transmitting resin layer 75, performing patterning using the photolithography technique, and performing baking. The lenses 78 and the projections PS may be formed to have the different heights HE1 and HE2 by being patterned, for example, using a half-exposure technique. This method allows the fourth modification to eliminate one manufacturing process as compared with the above-described embodiment. Steps ST1, ST2, and ST5 to ST8 are the same as the processes illustrated in FIG. 10.

Figure 15:
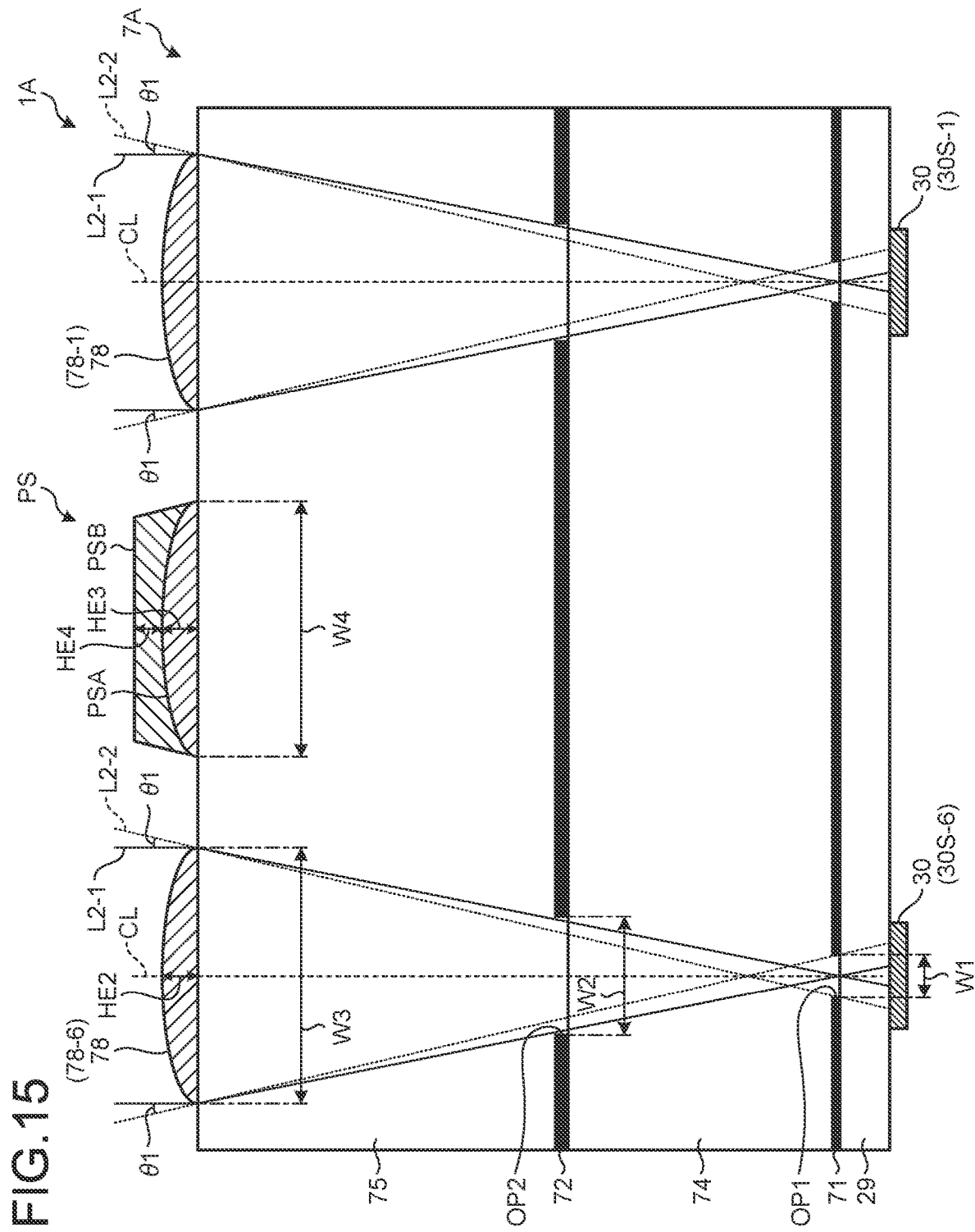
FIG. 15 is a sectional view schematically illustrating a detection device according a fifth modification of the embodiment.

FIG. 15 is a sectional view schematically illustrating a detection device according a fifth modification of the embodiment. As illustrated in FIG. 15, in an optical filter 7A of a detection device 1A according to the fifth modification, the projection PS includes a first projection PSA and a second projection PSB. The first projection PSA is provided in the same layer as that of the lens 78 on the second light-transmitting resin layer 75. The second projection PSB is provided so as to overlap the first projection PSA.

The first projection PSA is formed using the same material as that of the lens 78 in the same process as that of the lens 78 at Step ST3 illustrated in FIG. 10. The second projection PSB is formed above the first projection PSA using a material different from that of the lens 78 in the same process as Step ST4 illustrated in FIG. 10. That is, a method for manufacturing the detection device 1A of the fifth modification includes a process of forming the lens 78 and the first projection PSA in the same layer as that of the lens 78 (Step ST3), and a process of forming the second projection PSB so as to overlap the first projection PSA (Step ST4). The second projection PSB is formed so as to cover the entire first projection PSA and has the same width (diameter) as the width W4 of the first projection PSA.

In the present modification, the height of the projection PS is the total height of a height HE3 of the first projection PSA and a height HE4 of the second projection PSB. Thus, the projection PS can be easily formed to be higher than the height HE2 of the lens 78.

Figure 16:
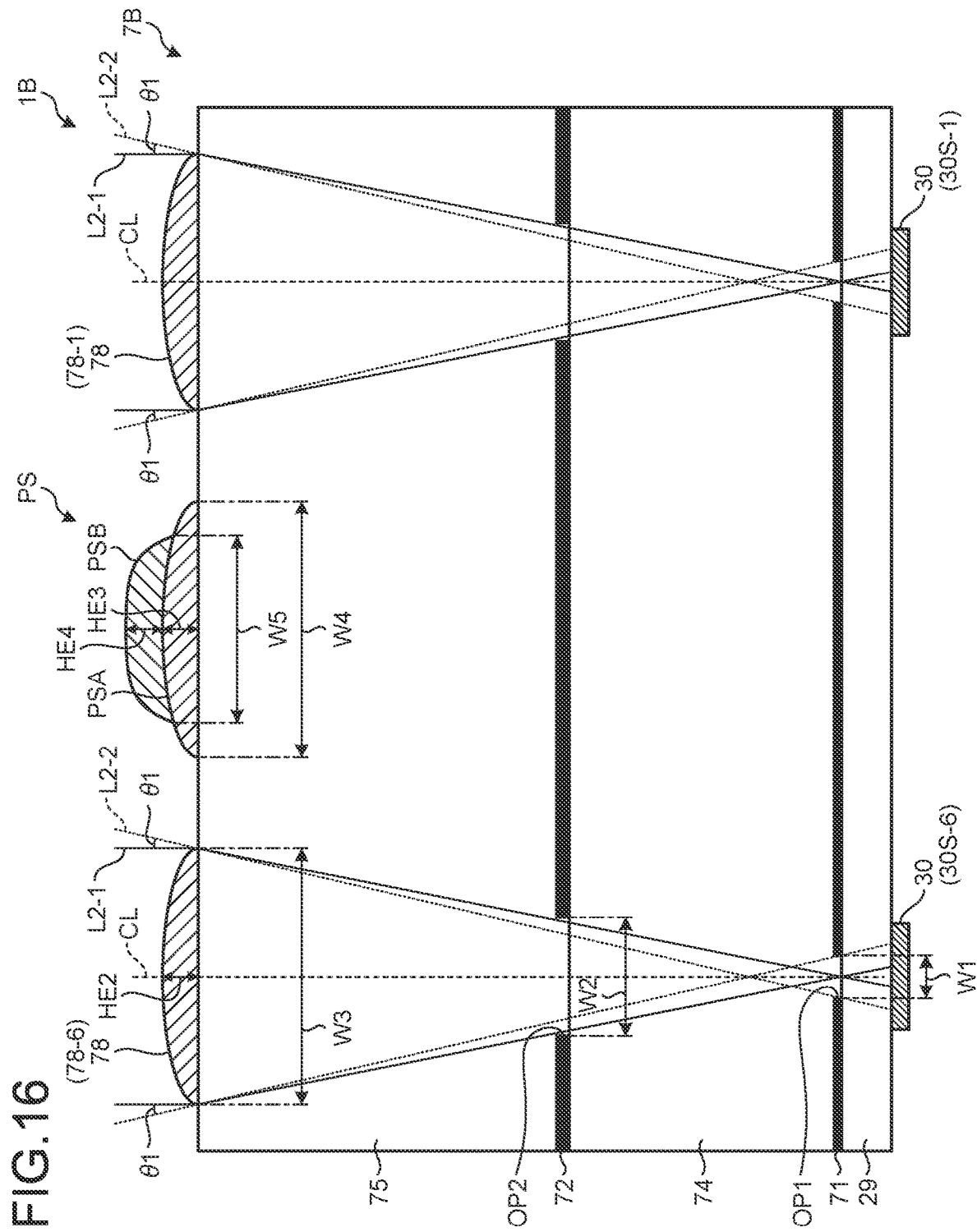
FIG. 16 is a sectional view schematically illustrating a detection device according a sixth modification of the embodiment.

FIG. 16 is a sectional view schematically illustrating a detection device according a sixth modification of the embodiment. As illustrated in FIG. 16, in an optical filter 7B of a detection device 1B according to the sixth modification, a width W5 (diameter) of the second projection PSB is less than the width W4 (diameter) of the first projection PSA. In other words, the second projection PSB is formed so as to project from the upper surface of the first projection PSA. In this manner, the first projection PSA and the second projection PSB may have different shapes and sizes.

The relation between the sizes of the first projection PSA and the second projection PSB is not limited to the example illustrated in FIG. 16 and may be reversed such that the width W5 (diameter) of the second projection PSB is greater than the width W4 (diameter) of the first projection PSA. For example, the width W4 of the first projection PSA may be set to be less than the width W3 of the lens 78, and the second projection PSB may be formed to have the same width as the width W3 of the lens 78 so as to cover the entire first projection PSA.

Figure 17:
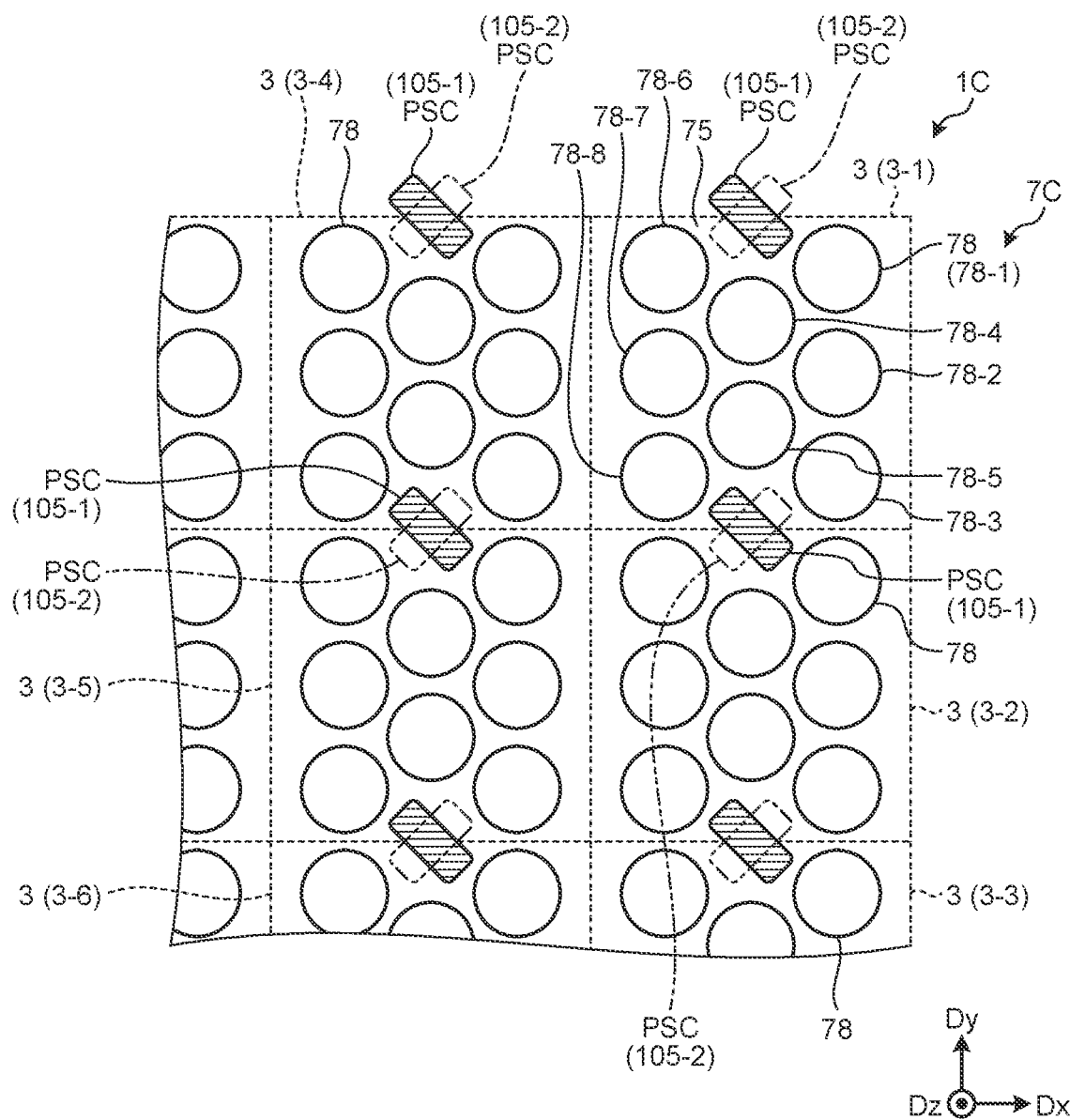
FIG. 17 is a plan view schematically illustrating a detection device according a seventh modification of the embodiment.

FIG. 17 is a plan view schematically illustrating a detection device according a seventh modification of the embodiment. In FIG. 17 illustrating a case where the pair of motherboards 105 are stacked together (refer to FIG. 11), projections PSC provided on the one motherboard 105-1 are illustrated with oblique lines added thereto, and the projections PSC provided on the other motherboard 105-2 are illustrated with long dashed double-short dashed lines.

As illustrated in FIG. 17, in an optical filter 7C of a detection device 1C according to the seventh modification, each of the projections PSC is formed to have a shape and size different from those of the lens 78. The projection PSC has a rectangular shape in a plan view as viewed from the third direction Dz. A direction along a long side of the projection PSC is slanted along a direction intersecting the first direction Dx and the second direction Dy. The shape of the projection PSC is not limited to the rectangular shape and may be an oval or an elliptical shape.

When the pair of motherboards 105 are stacked together, the projection PSC provided on the one motherboard 105-1 and the projection PSC provided on the other motherboard 105-2 are arranged so as to intersect each other. That is, the projections PSC are provided so as to at least partially contact each other.

In the seventh modification, even when spaces for providing the projections PSC are smaller, or lenses 78 are arranged more densely than in the above-described embodiment, the projections PSC can be provided in regions not overlapping the lenses 78 and the partial photodiodes 30S. In addition, the projection PSC is provided such that the direction along the long side of the projection PSC is slanted with respect to the first direction Dx and the second direction Dy. This configuration can ensure an overlapping area of the pair of projections PSC even if misalignment in position occurs when the pair of motherboards 105 are stacked together.

Figure 18:
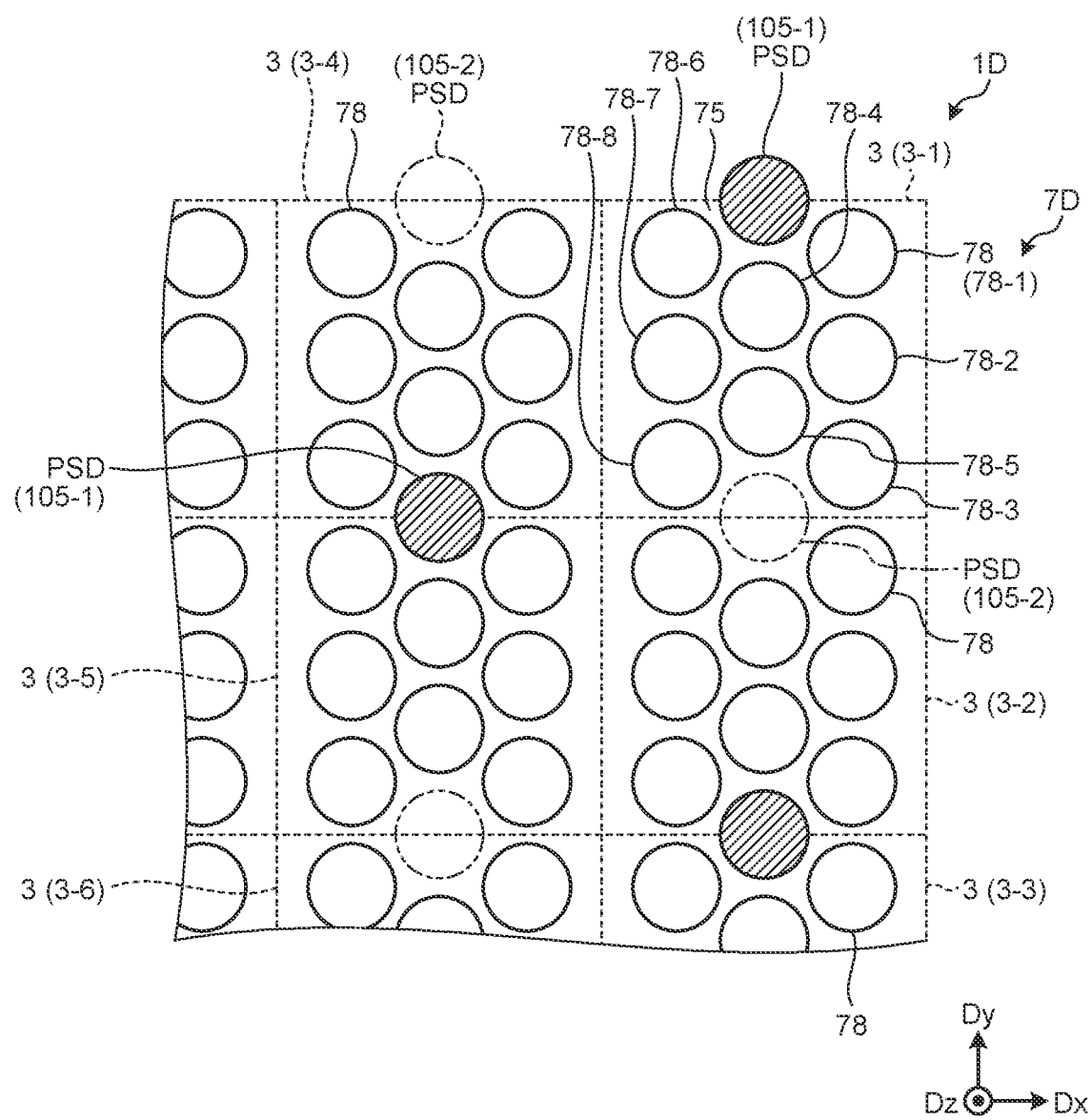
FIG. 18 is a plan view schematically illustrating a detection device according an eighth modification of the embodiment.
Figure 19:
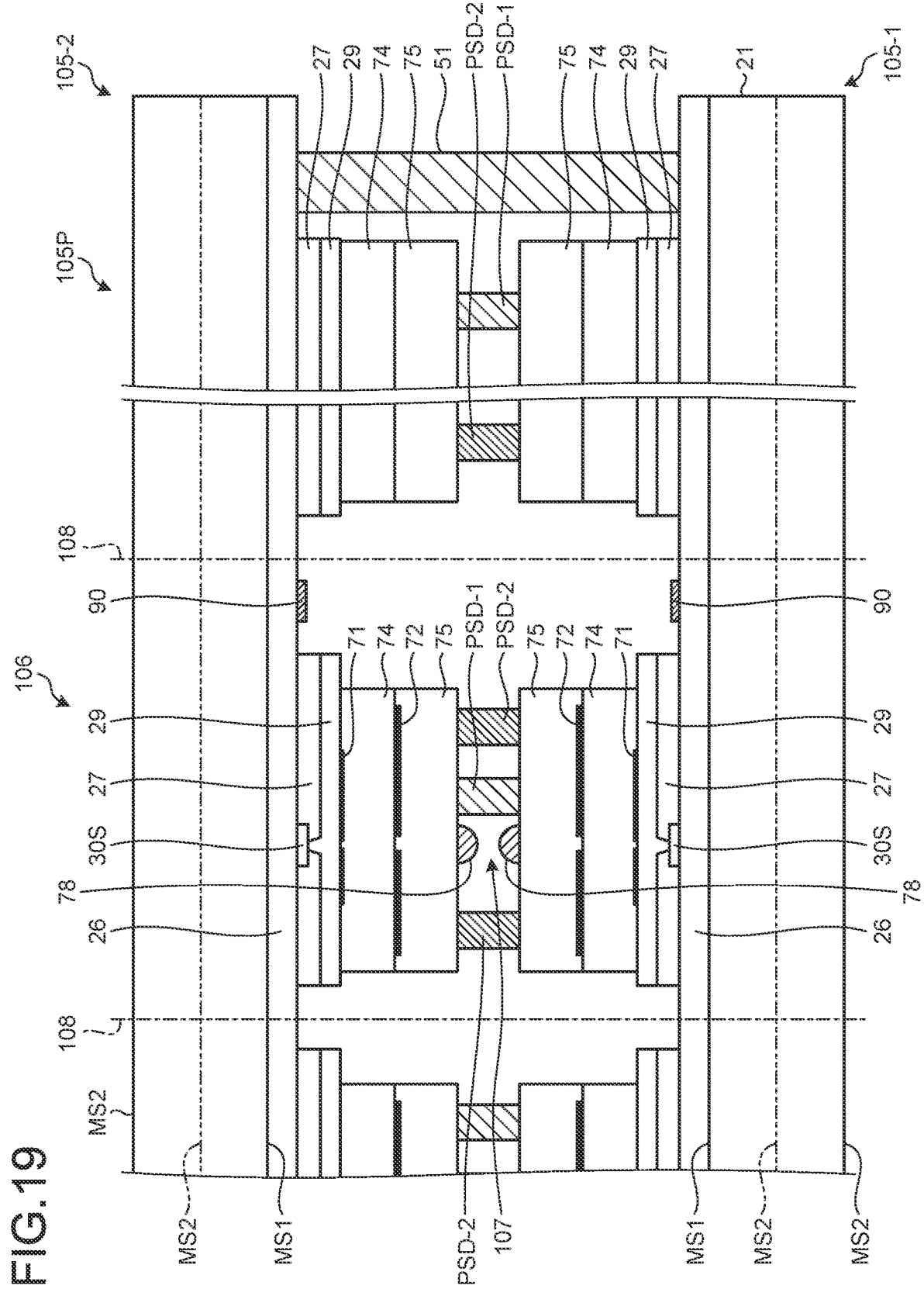
FIG. 19 is a sectional view for explaining a method for manufacturing the detection device according the eighth modification.

FIG. 18 is a plan view schematically illustrating a detection device according an eighth modification of the embodiment. FIG. 19 is a sectional view for explaining a method for manufacturing the detection device according the eighth modification. In FIG. 18 illustrating a case where the pair of motherboards 105 are stacked together (refer to FIG. 19), the projections PSC provided on the one motherboard 105-1 are illustrated with oblique lines added thereto, and the projections PSC provided on the other motherboard 105-2 are illustrated with long dashed double-short dashed lines.

As illustrated in FIG. 18, in an optical filter 7D of a detection device 1D according to the eighth modification, projections PSD are arranged one for every two detection elements 3 arranged in the second direction Dy. For example, on the one motherboard 105-1, the projection PSD is not provided at a boundary between the detection element 3-1 and the detection element 3-2, and the projection PSD is provided at a boundary between the detection element 3-2 and the detection element 3-3. That is, in one detection element column in which the detection elements 3 are arranged in the second direction Dy, the projection PSD is provided for every other boundary between the detection elements. In another detection element column adjacent to the one detection element column, the projection PSD is provided for every other boundary between the detection elements 3, in the same manner as the one detection element column. However, the forming positions of the projections PSD are different between the adjacent detection element columns. In other words, in the adjacent detection element columns, the projections PSD are arranged in a staggered manner.

On the other motherboard 105-2, the projection PSD is provided at the boundary between the detection element 3-1 and the detection element 3-2, and the projection PSD is not provided at the boundary between the detection element 3-2 and the detection element 3-3. That is, when the pair of motherboards 105 are stacked together, the projections PSD provided on the one motherboard 105-1 and the projections PSD provided on the other motherboard 105-2 are alternately arranged in the first direction Dx and the second direction Dy, and are thus provided at positions not overlapping each other, in the plan view.

As illustrated in FIG. 19, when the pair of motherboards 105 are stacked together, the projection PSD (PSD-1) of the one motherboard 105-1 abuts on a portion of the second light-transmitting resin layer 75 of the other motherboard 105-2 that is not provided with the lens 78. In the same manner, the projection PSD (PSD-2) of the other motherboard 105-2 abuts on a portion of the second light-transmitting resin layer 75 of the one motherboard 105-1 that is not provided with the lens 78. Also in the eighth modification, the gap 107 is formed between the lens 78 of the one motherboard 105-1 and the lens 78 of the other motherboard 105-2.

In the present modification, the projections PSD are formed to be higher, and the number of the projections PSD per unit area is smaller than in the above-described embodiment. In addition, since the projections PSD need not be arranged so as to overlap each other when the pair of motherboards 105 are stacked together, the allowable degree of misalignment in position between the pair of motherboards 105 can be increased.

The above-described modifications can be combined with one another. For example, the projection PSC illustrated in the seventh modification and the projection PSD illustrated in the eighth modification may each be combined with the fifth or the sixth modification. That is, the projections PSC and PSD can each have a structure obtained by stacking two layers of projections.

While the preferred embodiment of the present disclosure has been described above, the present disclosure is not limited to the embodiment described above. The content disclosed in the embodiment is merely exemplary, and can be variously changed within the scope not departing from the gist of the present disclosure. Any modification appropriately made within the scope not departing from the gist of the present disclosure also naturally belongs to the technical scope of the present disclosure. At least one of various omissions, replacements, and modifications of the components can be made without departing from the gist of the embodiment and the modifications thereof described above.

What is claimed is:

1. A detection device comprising:
a substrate;
a plurality of photodiodes arranged on a first principal surface of the substrate;
a protective film that covers the photodiodes;
a plurality of lenses provided for each of the photodiodes so as to face the photodiode with the protective film interposed between the lenses and the photodiodes; and
a projection provided between the lenses, wherein
a top of the projection is located at a position higher than a top of each of the lenses when viewed from the first principal surface,
the projection includes a first projection provided in same layer as a layer of the lenses, and a second projection provided so as to overlap the first projection, and
a diameter of the second projection is less than a diameter of the first projection.

2. The detection device according to claim 1, comprising:
a light-blocking layer that is provided between the photodiodes and the lenses and is provided with openings in regions overlapping the respective photodiodes; and
a light-transmitting resin layer provided between the light-blocking layer and the lenses, wherein
the lenses and the projection are provided on the light-transmitting resin layer, and
the lenses overlap the openings, and the projection overlaps a region of the light-blocking layer where the openings are not formed.

3. The detection device according to claim 2, wherein the projection is higher than a height of the lenses in a direction orthogonal to the first principal surface.

4. The detection device according to claim 1, wherein an overall length from the top to a bottom of the projection is greater than an overall length from the top to a bottom of the lens.

5. The detection device according to claim 1, wherein the first projection is formed of the same material as that of the lenses.

6. The detection device according to claim 1, wherein the projection has the same shape as a shape of the lenses in a plan view from a direction orthogonal to the substrate.

7. The detection device according to claim 1, wherein
each of the photodiodes includes a plurality of partial photodiodes, in each of which a p-type semiconductor layer, an i-type semiconductor layer, and an n-type semiconductor layer are staked,
the lenses are provided so as to overlap the respective partial photodiodes, and
the number of the projections is smaller than the number of the lenses.

8. The detection device according to claim 7, wherein
the substrate has a detection region that is divided into a plurality of detection elements each of which is provided with one or more of the partial photodiodes,
the lenses are provided so as to overlap the partial photodiodes in the detection electrodes, and
the projection is provided at a boundary between adjacent detection elements of the detection elements.

9. The detection device according to claim 8, wherein the projection is provided at a boundary between detection elements arranged in a first direction, of the detection elements.

10. The detection device according to claim 9, wherein in one detection element column in which the detection elements are arranged in the first direction in the detection region, the projection is provided for every other boundary between the detection elements.

11. The detection device according to claim 10, wherein
in another detection element column adjacent to the one detection element column, the projection is provided for every other boundary between the detection elements, and
in the adjacent two detection element columns, the projections are arranged in a staggered manner.

12. A detection device comprising:
a substrate;
a plurality of photodiodes arranged on a first principal surface of the substrate;
a protective film that covers the photodiodes;
a plurality of lenses provided for each of the photodiodes so as to face the photodiode with the protective film interposed between the lenses and the photodiodes; and
a projection provided between the lenses,
wherein
a top of the projection is located at a position higher than a top of each of the lenses when viewed from the first principal surface,
each of the photodiodes includes a plurality of partial photodiodes, in each of which a p-type semiconductor layer, an i-type semiconductor layer, and an n-type semiconductor layer are staked,
the lenses are provided so as to overlap the respective partial photodiodes,
the number of the projections is smaller than the number of the lenses,
the substrate has a detection region that is divided into a plurality of detection elements each of which is provided with one or more of the partial photodiodes,
the lenses are provided so as to overlap the partial photodiodes in the detection electrodes,
the projection is provided at a boundary between adjacent detection elements of the detection elements,
the projection is provided at a boundary between detection elements arranged in a first direction, of the detection elements, and
in one detection element column in which the detection elements are arranged in the first direction in the detection region, the projection is provided for every other boundary between the detection elements.

13. The detection device according to claim 12, wherein
in another detection element column adjacent to the one detection element column, the projection is provided for every other boundary between the detection elements, and
in the adjacent two detection element columns, the projections are arranged in a staggered manner.

* * * * *